(12) United States Patent
Chae et al.

(10) Patent No.: US 9,634,193 B2
(45) Date of Patent: Apr. 25, 2017

(54) LIGHT EMITTING DIODE AND METHOD OF MANUFACTURING THE SAME

(71) Applicant: Seoul Viosys Co., Ltd., Ansan-si (KR)

(72) Inventors: Jong Hyeon Chae, Ansan-si (KR); Jong Min Jang, Ansan-si (KR); Won Young Roh, Ansan-si (KR); Daewoong Suh, Ansan-si (KR); Dae Sung Cho, Ansan-si (KR); Joon Sup Lee, Ansan-si (KR); Kyu Ho Lee, Ansan-si (KR); Chi Hyun In, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 14/671,491

(22) Filed: Mar. 27, 2015

(65) Prior Publication Data

US 2015/0200334 A1   Jul. 16, 2015

Related U.S. Application Data

(63) Continuation of application No. 14/345,382, filed as application No. PCT/KR2012/007358 on Sep. 14, 2012, now abandoned.

(30) Foreign Application Priority Data

Sep. 16, 2011 (KR) .......... 10-2011-0093396
Feb. 16, 2012 (KR) .......... 10-2012-0015758
May 17, 2012 (KR) .......... 10-2012-0052722

(51) Int. Cl.
*H01L 33/12*   (2010.01)
*H01L 33/40*   (2010.01)
(Continued)

(52) U.S. Cl.
CPC ........ *H01L 33/405* (2013.01); *H01L 33/0075* (2013.01); *H01L 33/12* (2013.01);
(Continued)

(58) Field of Classification Search
CPC ....... H01L 33/405; H01L 33/44; H01L 33/46; H01L 33/12
See application file for complete search history.

(56) References Cited

U.S. PATENT DOCUMENTS 6,486,499 B1   11/2002  Krames et al.
2005/0212006 A1   9/2005  Kwak et al.
(Continued)

FOREIGN PATENT DOCUMENTS

JP   H03-250733   11/1991
JP   H11-354541   12/1999
(Continued)

OTHER PUBLICATIONS

European Search Report issued Apr. 21, 2015, in EPO Patent Application No. 12832213.8.
(Continued)

*Primary Examiner* — Daniel Whalen
*Assistant Examiner* — Suberr Chi
(74) *Attorney, Agent, or Firm* — H.C. Park & Associates, PLC

(57) ABSTRACT

A light-emitting diode including a substrate, a first semiconductor layer disposed on the substrate, an active layer disposed on the first semiconductor layer, a second semiconductor layer disposed on the active layer and having a conductivity type different than that of the first semiconductor layer, and a reflective pattern disposed on the second semiconductor layer and configured to reflect light emitted from the active layer, the reflective pattern having heterogeneous metal layers and configured to absorb stress caused by differences in coefficient of thermal expansion between the heterogeneous metal layers.

20 Claims, 20 Drawing Sheets

(51) Int. Cl.

| | |
|---|---|
| *H01L 33/22* | (2010.01) |
| *H01L 33/20* | (2010.01) |
| *H01L 33/38* | (2010.01) |
| *H01L 33/00* | (2010.01) |
| *H01L 33/14* | (2010.01) |
| *H01L 33/32* | (2010.01) |
| *H01L 33/44* | (2010.01) |
| *H01L 33/42* | (2010.01) |
| *H01L 33/46* | (2010.01) |
| *H01L 33/48* | (2010.01) |
| *H01L 33/62* | (2010.01) |
| *H01L 33/08* | (2010.01) |

(52) U.S. Cl.
CPC .............. *H01L 33/14* (2013.01); *H01L 33/20* (2013.01); *H01L 33/22* (2013.01); *H01L 33/32* (2013.01); *H01L 33/38* (2013.01); *H01L 33/42* (2013.01); *H01L 33/44* (2013.01); *H01L 33/46* (2013.01); *H01L 33/486* (2013.01); *H01L 33/62* (2013.01); *H01L 33/08* (2013.01); *H01L 2933/0016* (2013.01); *H01L 2933/0025* (2013.01); *H01L 2933/0058* (2013.01)

(56) References Cited

U.S. PATENT DOCUMENTS

| | | | |
|---|---|---|---|
| 2006/0001035 | A1 | 1/2006 | Suehiro et al. |
| 2006/0011935 | A1* | 1/2006 | Krames et al. .............. 257/99 |
| 2007/0231963 | A1* | 10/2007 | Doan et al. .................... 438/107 |
| 2008/0185609 | A1* | 8/2008 | Kozawa ............... H01L 33/405 |
| | | | 257/99 |
| 2008/0210969 | A1* | 9/2008 | Yuan et al. ..................... 257/98 |
| 2009/0283787 | A1* | 11/2009 | Donofrio et al. ............... 257/98 |
| 2010/0072489 | A1 | 3/2010 | McLaurin et al. |
| 2010/0078656 | A1 | 4/2010 | Seo et al. |
| 2010/0151604 | A1* | 6/2010 | Kal ....................... H01L 27/153 |
| | | | 438/29 |
| 2010/0213491 | A1* | 8/2010 | Lu ........................ H01L 33/504 |
| | | | 257/98 |
| 2011/0084294 | A1 | 4/2011 | Yao |
| 2011/0198654 | A1* | 8/2011 | Naya ................................ 257/98 |
| 2011/0215364 | A1 | 9/2011 | Sugawara et al. |
| 2012/0261702 | A1* | 10/2012 | Su et al. ......................... 257/98 |
| 2013/0256732 | A1* | 10/2013 | Miki ..................... H01L 33/405 |
| | | | 257/98 |

FOREIGN PATENT DOCUMENTS

| | | |
|---|---|---|
| JP | 2007-27540 | 2/2007 |
| JP | 2007-080899 | 3/2007 |
| JP | 2008-305874 | 12/2008 |
| JP | 2010-171382 | 8/2010 |
| JP | 2011-187556 | 9/2011 |
| KR | 10-2005-0095721 | 9/2005 |
| KR | 10-2006-0134490 | 12/2006 |
| KR | 10-2010-0036617 | 4/2010 |
| KR | 10-2012-0027318 | 3/2012 |
| WO | 2005-091848 | 10/2005 |
| WO | 2007/037762 | 4/2007 |
| WO | 2010-132139 | 11/2010 |
| WO | 2010/132139 | 11/2010 |
| WO | 2011-050640 | 5/2011 |

OTHER PUBLICATIONS

International Search Report for PCT/KR2012/007358 dated Feb. 19, 2013.
Non-Final Office Action dated Nov. 6, 2014, issued in U.S. Appl. No. 14/345,382.
Final Office Action dated Mar. 3, 2015, issued in U.S. Appl. No. 14/345,382.
Non-Final Office Action dated Jul. 15, 2015, in U.S. Appl. No. 14/345,382.
Japanese Office Action dated Dec. 6, 2016 in Japanese Patent Application No. 2016-001347 (with English translation).
Final Office Action issued Jan. 6, 2016, in U.S. Appl. No. 14/345,382.
Korean Office Action issued May 27, 2016 for Korean Patent Application No. 10-2012-0052722 with English Translation.

* cited by examiner (a)

(b)

(a)

(b)

(a)

(b)

(a)

(b)

A - A'

A – A'

A – A'

B - B'

C - C'

LIGHT EMITTING DIODE AND METHOD OF MANUFACTURING THE SAME

CROSS-REFERENCE TO RELATED APPLICATIONS

This application is a continuation of U.S. patent application Ser. No. 14/345,382, filed on Mar. 17, 2014, which is the National Stage entry of International Application No. PCT/KR2012/007358, filed on Sep. 14, 2012, and claims priority from and the benefit of Korean Patent Application No. 10-2011-0093396, filed on Sep. 16, 2011, Korean Patent Application No. 10-2012-0015758, filed on Feb. 16, 2012, and Korean Patent Application No. 10-2012-0052722, filed on May 17, 2012, all of which are incorporated herein by reference for all purposes as if fully set forth herein.

BACKGROUND

Field

The present invention relates to a light emitting diode, and more particularly, to a flip chip type light emitting diode having improved luminous efficacy.

Discussion of the Background

After the development of gallium nitride (GaN) based light emitting diodes, GaN-based LEDs have been applied to various fields such as natural color LED display devices, LED signboards, white LEDs, and the like.

In general, a gallium nitride based light emitting diode is formed by growing epitaxial layers on a substrate such as a sapphire substrate, and include an N-type semiconductor layer, a P-type semiconductor layer, and an active layer interposed therebetween. Then, an N-electrode pad is formed on the N-type semiconductor layer and a P-electrode pad is formed on the P-type semiconductor layer. For operation, the light emitting diode is electrically connected to an external power source through the electrode pads. At this time, current flows from the P-electrode pad to the N-electrode pad through the semiconductor layers.

On the other hand, in order to improve heat dissipation while preventing light loss by the P-electrode pad, a light emitting diode having a flip chip structure is used in the art, and various electrode structures have been suggested to help current spreading in a large area flip chip type light emitting diode (see U.S. Pat. No. 6,486,499). For example, a reflective electrode is formed on the P-type semiconductor layer, and extensions for current spreading are formed on a region of the N-type semiconductor layer exposed by etching the P-type semiconductor layer and the active layer.

The reflective electrode formed on the P-type semiconductor layer reflects light generated in the active layer to enhance light extraction efficiency and assists in current spreading in the P-type semiconductor layer. On the other hand, the extensions connected to the N-type semiconductor layer assist in current spreading in the N-type semiconductor layer such that light can be uniformly generated in a wide active area. Particularly, a light emitting diode having a large area of about 1 mm² or more requires current spreading not only in the P-type semiconductor layer but also in the N-type semiconductor layer.

However, conventional techniques employ linear extensions causing limitation in current spreading due to high resistance thereof. Moreover, since a reflective electrode is disposed only on the P-type semiconductor layer, significant light loss occurs due to the pads and the extensions instead of being reflected by the reflective electrode.

Further, in the flip chip structure, light is emitted through a substrate. Accordingly, after semiconductor layers are formed on the substrate, a metallic reflective layer is formed above the semiconductor layers or a current spreading layer such that light can be reflected by the reflective layer.

FIG. 1 is a partial sectional view of a light emitting diode including a reflective layer in the related art.

Referring to FIG. 1, an ohmic layer 12 and a reflective layer 13 are disposed on a mesa layer 10. In addition, a barrier layer 14 surrounds a side surface of the ohmic layer 12 while surrounding an upper portion and side surface of the reflective layer 13.

The mesa layer 10 is a semiconductor area grown by epitaxial growth, and the ohmic layer 12 is composed of a conductive metal or a conductive oxide. In addition, the reflective layer 13 reflects light generated in the mesa layer 10 or a stack below the mesa layer. The reflective layer 13 is formed of sliver (Ag) or aluminum (Al).

The barrier layer 14 surrounding the upper portion and side surface of the reflective layer 13 has a structure wherein first barrier layers 14A and second barrier layers 14B are alternately stacked one above another. The first barrier layers 14A include nickel and the second barrier layers 14B include tungsten (W) or tungsten titanium (TiW). The barrier layer 14 prevents diffusion of metal elements constituting the reflective layer 13. On the other hand, the reflective layer 13 has a higher coefficient of thermal expansion than the barrier layer 14. For example, Ag has a coefficient of thermal expansion at room temperature of 18.9 um·m$^{-1}$·K$^{-1}$, and W has a coefficient of thermal expansion at room temperature of 4.5 um·m$^{-1}$·K$^{-1}$. Namely, there is a significant difference in coefficient of thermal expansion between the reflective layer 13 and the barrier layer 14.

Such a significant difference in coefficient of thermal between the reflective layer 13 and the barrier layer 14 induces stress in the reflective layer 13. Accordingly, the reflective layer 13 is separated from the ohmic layer 12 or the mesa layer 10 under the ohmic layer 12 due to stress generated in the reflective layer 13 at the same temperature.

On the other hand, various techniques have been developed to improve performance of the light emitting diode, that is, internal quantum efficiency and external quantum efficiency. Among various attempts to improve external quantum efficiency, a technique for improving light extraction efficiency has been developed in the art.

SUMMARY

The present invention is aimed at providing a light emitting diode having improved current spreading performance.

In addition, the present invention is aimed at providing a light emitting diode having improved light extraction efficiency by improving reflectivity.

Further, the present invention is aimed at providing a method of manufacturing a light emitting diode, which can improve current spreading performance while preventing a complicated manufacturing process.

Further, the present invention is aimed at providing a light emitting diode capable of relieving stress caused by a reflective layer, and a method of manufacturing the same.

Further, the present invention is aimed at providing a technique for improving light extraction efficiency through surface texturing by an inexpensive and simple process.

In accordance with one aspect of the present invention, a light emitting diode includes a first conductive type semiconductor layer; a plurality of mesas separated from each other on the first conductive type semiconductor layer and each including an active layer and a second conductive type semiconductor layer; reflective electrodes each disposed on the corresponding mesa area and in ohmic contact with the second conductive type semiconductor layer; and a current spreading layer covering the plurality of mesas and the first conductive type semiconductor layer to be electrically isolated from the mesas, and including first openings formed in upper regions of the mesas to expose the reflective electrodes therethrough, respectively, the current spreading layer being in ohmic contact with the first conductive type semiconductor layer.

Since the current spreading layer covers the plurality of mesas and the first conductive type semiconductor layer, the light emitting diode has improved current spreading performance through the current spreading layer.

The first conductive type semiconductor layer is continuously formed. In addition, the plurality of mesas may have a longitudinally elongated shape and extend parallel to each other towards one side of the substrate, and the first openings may be biased towards the same ends of the plurality of mesas. Accordingly, it is possible to achieve easy formation of pads connecting the reflective electrodes exposed through the openings of the current spreading layer.

The current spreading layer may include a reflective metal such as Al. Accordingly, the light emitting diode allows light reflection not only by the reflective electrodes, but also by the current spreading layer, whereby light travelling through side surfaces of the plurality of mesas and the first conductive type semiconductor layer can be reflected.

Each of the reflective electrodes may include a reflective metal layer and a barrier metal layer. Further, the barrier metal layer may cover an upper surface and a side surface of the reflective metal layer. As such, the light emitting diode prevents the reflective metal layer from being exposed outside, thereby preventing deterioration of the reflective metal layer.

Each of the reflective electrodes may further include a stress relieving layer formed between the reflective metal layer and the barrier metal layer and having a coefficient of thermal expansion between the coefficient of thermal expansion of the reflective metal layer and the coefficient of thermal expansion of the barrier metal layer. The stress relieving layer relieves stress applied to the reflective metal layer, thereby preventing the reflective metal layer from being delaminated from the second conductive type semiconductor layer.

The light emitting diode may further include an upper insulation layer covering at least part of the current spreading layer and including second openings formed in upper regions of the mesas to expose the reflective electrodes therethrough, respectively; and a second pad disposed on the upper insulation layer and electrically connected to the reflective electrodes exposed through the first and second openings. The light emitting diode may further include a first pad connected to the current spreading layer. The first pad and the second pad may have the same shape and the same size, thereby facilitating flip-chip bonding.

The light emitting diode may further include a lower insulation layer disposed between the plurality of mesas and the current spreading layer and electrically isolating the current spreading layer from the plurality of mesas. The lower insulation layer may include third openings formed in upper regions of the mesas to expose the reflective electrodes therethrough, respectively.

In addition, the first openings may have a greater width than the third openings to allow all of the third openings to be exposed. In other words, the first openings have sidewalls disposed on the lower insulation layer. In addition, the light emitting diode may further include an upper insulation layer covering at least part of the current spreading layer and including second openings through which the reflective electrodes are exposed. The upper insulation layer covers the sidewalls of the first openings.

The lower insulation layer may be a reflective dielectric layer, for example, a distributed Bragg reflector (DBR).

The light emitting diode may further include a substrate including the first conductive semiconductor formed on one surface thereof and a ground texture formed on the other surface thereof.

The ground texture may be formed by grinding the other surface of the substrate, followed by treatment with phosphoric acid or a mixture of sulfuric acid and phosphoric acid.

The substrate may include a chamfered structure at corners of the other surface thereof. In addition, the substrate may further include an anti-reflective layer on the other surface thereof.

The reflective metal layer may include one of Al, Al alloys, Ag, and Ag alloys, and the barrier metal layer may include one of W, TiW, Mo, Ti, Cr, Pt, Rh, Pd, and Ni. Further, the stress relieving layer may be formed as a single layer of Ag, Cu, Ni, Pt, Ti, Rh, Pd or Cr, or as a composite layer of a plurality of metals selected from Cu, Ni, Pt, Ti, Rh, Pd or Au.

In one embodiment, the reflective metal layer is formed of Al or Al alloys; the barrier metal layer includes one of Ti, Cr, Pt, Rh, Pd and Ni; the stress relieving layer may be formed as a single layer of Ag or Cu, or as a composite layer of a plurality of metals selected from Ni, Au, Cu or Ag.

In another embodiment, the reflective metal layer may include one of Ag and Ag alloys; the barrier metal layer may include W, TiW or Mo; the stress relieving layer may be formed as a single layer of Cu, Ni, Pt, Ti, Rh, Pd or Cr, or as a composite layer of a plurality of metals selected from Cu, Ni, Pt, Ti, Rh, Pd, Cr or Au.

In a further embodiment, the reflective metal layer may be formed of anyone of Ag or Ag alloys; the barrier metal layer may include Pt or Ni; the stress relieving layer may be formed as a single layer of Cu, Cr, Rh, Pd, TiW or Ti, or as a composite layer of a plurality of metals selected from Ni, Au or Cu.

In accordance with another aspect of the present invention, a method of manufacturing a light emitting diode includes: forming a semiconductor stack including a first conductive type semiconductor layer, an active layer and a second conductive type semiconductor layer on a substrate; patterning the second conductive type semiconductor layer and the active layer to form a plurality of mesas on the first conductive type semiconductor layer, followed by forming reflective electrodes on the plurality of mesas; and forming a current spreading layer covering the plurality of mesas and the first conductive type semiconductor layer, the current spreading layer being electrically isolated from the plurality of mesas while exposing at least part of the reflective electrodes.

Forming reflective electrodes may include: forming a reflective metal layer on the second conductive type semiconductor layer, and forming a barrier metal layer to cover an upper surface and a side surface of the reflective metal layer.

The reflective electrodes may be formed after the plurality of mesas is formed. However, the present invention is not limited thereto, and the mesas may be formed after the reflective electrodes are formed.

Forming reflective electrodes may further include forming a stress relieving layer having a coefficient of thermal expansion between the coefficient of thermal expansion of the reflective metal layer and the coefficient of thermal expansion of barrier metal layer, before forming the barrier metal layer.

The method of manufacturing a light emitting diode may further include, before forming the current spreading layer, forming a lower insulation layer between the plurality of mesas and the current spreading layer to expose at least part of the reflective electrodes therethrough while electrically isolating the current spreading layer from the plurality of mesas and the reflective electrodes.

The method of manufacturing a light emitting diode may further include forming a ground texture on a surface of the substrate, wherein the semiconductor stack is formed on one surface of the substrate and the ground texture is formed on the other surface thereof.

Forming a ground texture may include grinding the other surface of the substrate, followed by treating the ground other surface with phosphoric acid or a mixture of sulfuric acid and phosphoric acid.

Embodiments of the present invention may provide a light emitting diode, particularly, a flip-chip type light emitting diode, which has improved current spreading performance. In addition, the light emitting diode has improved reflectivity, thereby providing improved light extraction efficiency. Further, the light emitting diodes has a simple structure of plural mesas, thereby simplifying a process of manufacturing the light emitting diode.

Further, according to the embodiments of the invention, the light emitting diode can relieve stress due to difference in coefficient of thermal expansion between a reflective metal layer and a barrier metal layer using a stress relieving layer which has a coefficient of thermal expansion, which is lower than that of the reflective metal layer and higher than that of the barrier metal layer, thereby preventing separation of the reflective metal layer from the semiconductor layer or the ohmic layer.

Furthermore, the light emitting diode according to the embodiments of the invention allows continuous formation of the reflective metal layer, the stress relieving layer and the barrier metal layer using a photoresist pattern, thereby enabling reduction of process costs.

Furthermore, the light emitting diode according to the embodiments of the invention allows surface texturing through a simple process at low cost, thereby providing improved light extraction efficiency.

It should be understood that the present invention is not limited to the above advantageous effects and other aspects, features and advantageous effects of the present invention will become apparent to those skilled in the art from the following descriptions.

DETAILED DESCRIPTION OF THE ILLUSTRATED EMBODIMENTS

Figure 1:
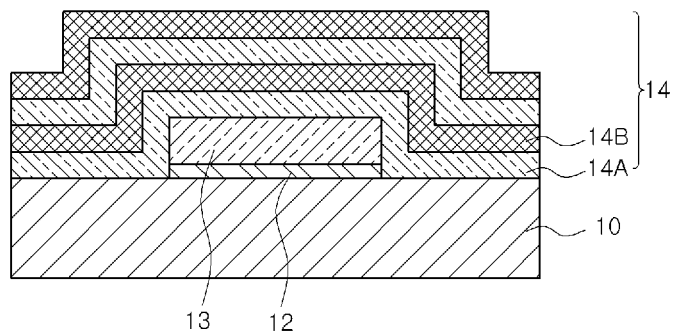
FIG. 1 is a partial sectional view of a light emitting diode including a reflective layer in the related art.

Hereinafter, embodiments of the present invention will be described in more detail with reference to the accompanying drawings. It should be understood that the following embodiments are given by way of illustration only to provide a thorough understanding of the invention to those skilled in the art. Therefore, the present invention is not limited to the following embodiments and may be embodied in different ways. Further, the widths, lengths, and thicknesses of certain elements, layers or features may be exaggerated for clarity, and like components will be denoted by like reference numerals throughout the specification.

Herein, it will be understood that, when a layer is referred to as being "on" another layer or substrate, it can be directly formed on the other layer or substrate, or an intervening layer(s) may also be present therebetween. In addition, spatially relative terms, such as "above," "upper (portion)," "upper surface," and the like may be understood as meaning "below," "lower (portion)," "lower surface," and the like according to a reference orientation. In other words, the expressions of spatial orientations are to be construed as indicating relative orientations instead of absolute orientations.

For the purposes of this disclosure, it will be understood that, although the terms "first", "second", etc. may be used herein to distinguish various elements, components, regions, layers and/or sections from one another, these elements, components, regions, layers and/or sections should not be limited by these terms. In addition, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Figure 2:
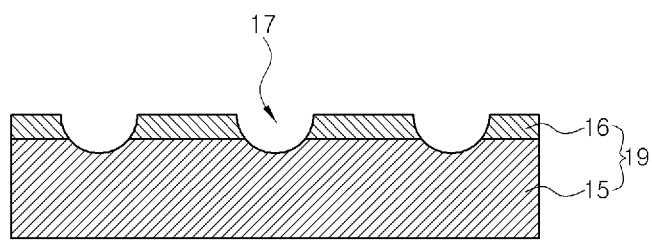
FIG. 2 is a sectional view of a substrate which may be used in manufacture of a light emitting diode in accordance with one embodiment of the present invention.

FIG. 2 is a sectional view of a substrate which may be used in manufacture of a light emitting diode in accordance with one embodiment of the present invention.

Referring to FIG. 2, a substrate according to one embodiment of the invention is a patterned substrate 19. The patterned substrate 19 includes a substrate 15 and an anti-reflective layer 16.

The substrate 15 has recessed depressions 17. The depressions 17 may have a circular or elliptical shape. Particularly, the depressions 17 may be formed in a regular pattern. For example, the depressions 17 may be island type or line type depressions arranged at constant intervals.

The substrate 15 may be a sapphire ($Al_2O_3$) substrate, a silicon carbide (SiC) substrate, a gallium nitride (GaN) substrate, an indium gallium nitride (InGaN) substrate, an aluminum gallium nitride (AlGaN) substrate, an aluminum nitride (AlN) substrate, a gallium oxide ($Ga_2O_3$) substrate, or a silicon substrate. Specifically, the substrate 15 may be a sapphire substrate.

The anti-reflective layer 16 may be disposed between the depressions 17. The anti-reflective layer 16 is formed to minimize reflection of light traveling towards the substrate 15. When the substrate 15 is a sapphire substrate, the anti-reflective layer 16 may be formed of materials having an index of refraction ranging from 1.7 to 2.2. Particularly, the anti-reflective layer 16 may be a silicon nitride layer having an index of refraction ranging from 2.0 to 2.1.

In addition, when incident light has a wavelength of $\lambda$, the thickness of the anti-reflective layer 16 may set to an integer multiple of $\lambda/4$. Here, the thickness of the anti-reflective layer 16 may have a variation of ±30% from the integer multiple of $\lambda/4$.

Figure 3:
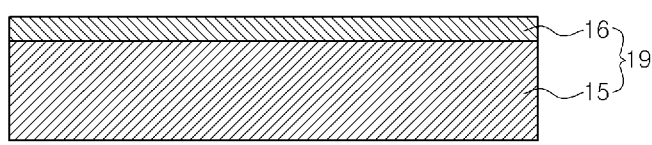
FIG. 3 to FIG. 5 are sectional views illustrating a method of manufacturing a patterned substrate shown in FIG. 2.
Figure 4:
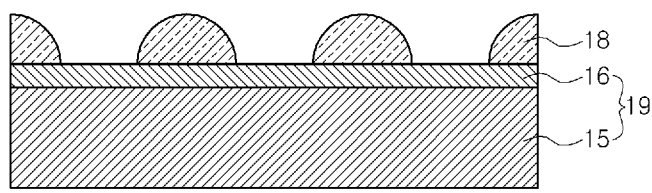
Figure 5:
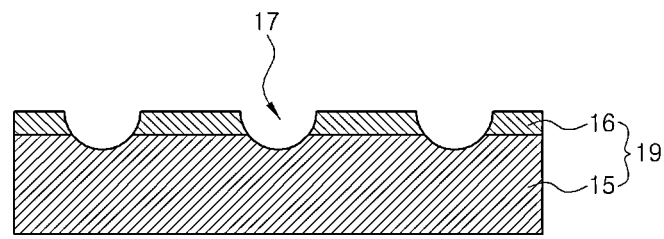

FIG. 3 to FIG. 5 are sectional views illustrating a method of manufacturing a patterned substrate shown in FIG. 2.

Referring to FIG. 3, an anti-reflective layer 16 is formed on a substrate 15. The anti-reflective layer 16 may be a silicon nitride layer and has a thickness of an integer multiple of $\lambda/4$ when incident light has a wavelength of $\lambda$. Here, the thickness of the anti-reflective layer 16 may have a variation of ±30% of the integer multiple of $\lambda/4$.

Referring to FIG. 4, a photoresist is deposited onto the anti-reflective layer 16 to form a photoresist pattern 18. The photoresist pattern 18 may have substantially a semi-spherical shape. The shape of the depressions 17 shown in FIG. 2 may be adjusted according to the shape of the photoresist pattern 18. To form the semi-spherical photoresist pattern 18, the photoresist deposited on the anti-reflective layer is subjected to exposure and development processes. As a result, a photoresist pattern having a substantially rectangular cross-section is formed. Next, the photoresist pattern is subjected to a reflow process. By the reflow process, the photoresist having viscosity is formed into a substantially semi-spherical photoresist pattern 18 by cohesion between molecules.

Next, etching is performed using the semi-spherical photoresist pattern 18 as an etching mask. Herein, etching may be anisotropic dry etching. As a result, etching is intensively carried out in open areas through the photoresist pattern 18. Here, since the photoresist pattern 18 has a semi-spherical shape, the degree of etching is gradually weakened from an edge of the semi-spherical shape to the central region of the semi-spherical shape. Further, as etching proceeds, the semi-spherical photoresist pattern 18 is gradually removed. Accordingly, a semi-spherical pattern may be formed on an upper surface of the substrate.

Alternatively, after semi-spherical depressions are formed on the anti-reflective layer 16 on the substrate 15 or on another sacrificial layer by isotropic etching, anisotropic etching may be performed on the substrate 15 using the anti-reflective layer 16 or the sacrificial layer as an etching mask, so that the semi-spherical depressions 17 can be formed on an upper surface of the substrate 15.

Referring to FIG. 5, as described above, patterned substrate 19 having the semi-spherical depressions 17 are formed through etching. The surface of the substrate is exposed inside the depressions 17, and the anti-reflective layer 16 is disposed between the depressions 17. The photoresist pattern remaining upon etching of FIG. 4 can be removed, whereby the anti-reflective layer 16 can be exposed.

In addition, the remaining anti-reflective layer 16 may also be removed, as needed.

Through the aforementioned process, the substrate having the depressions 17 formed on the surface thereof in a regular pattern may be formed.

Further, according to this embodiment, the depressions may be formed in various shapes according to the shape of the photoresist pattern. For example, the photoresist pattern may be formed in a triangular shape or a trapezoidal shape instead of the semi-spherical shape by adjusting an exposure angle, with the photoresist deposited on the substrate. When etching is performed using the photoresist pattern having a triangular shape or a trapezoidal shape as an etching mask, the depressions formed on the substrate have an inversed triangular shape or an inversed trapezoidal shape recessed from the surface of the substrate.

In this embodiment, the depressions may be formed to various shapes recessed from the surface of the substrate. Here, the depressions are arranged in a pattern of regular arrangement.

FIG. 6 to FIG. 10 are sectional views illustrating a method of manufacturing a light emitting diode in accordance with one embodiment of the present invention, and in each of the figures, (a) is a plan view and (b) is a sectional view taken along line A-A.

Figure 6:
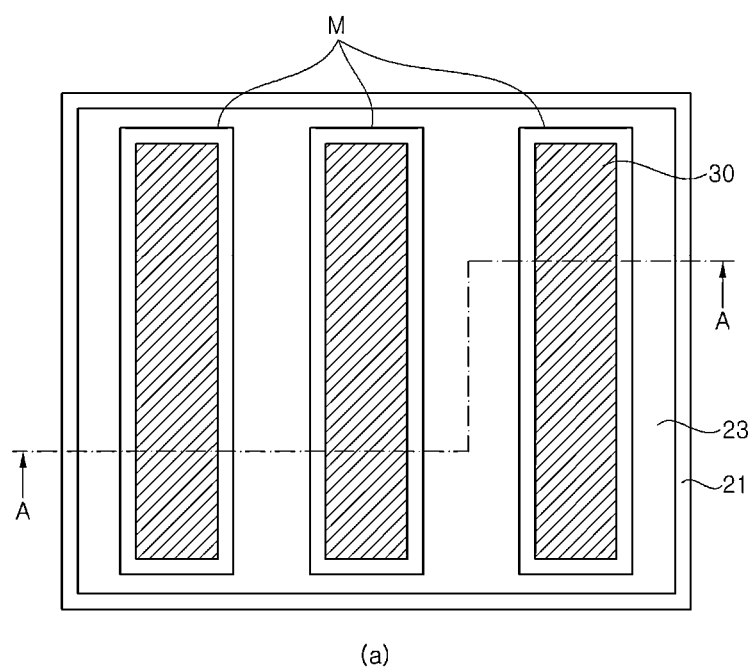
FIG. 6 to FIG. 10 are sectional views illustrating a method of manufacturing a light emitting diode in accordance with one embodiment of the present invention and, in each of the figures, (a) is a plan view and (b) is a sectional view taken along line A-A.
Figure 6:
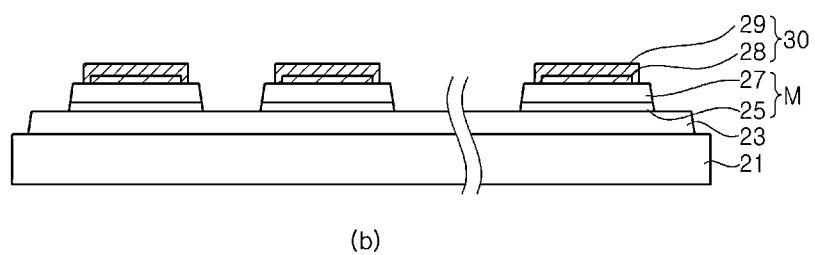

First, referring to FIG. 6, a first conductive type semiconductor layer 23 is formed on a substrate 21, and a plurality of mesas M separated from each other is formed on the first conductive type semiconductor layer 23. Each of the mesas M includes an active layer 25 and a second conductive type semiconductor layer 27. The active layer 25 is disposed between the first conductive type semiconductor layer 23 and the second conductive type semiconductor layer 27. In addition, reflective electrodes 30 are disposed on the plurality of mesas M, respectively.

The plural mesas M may be formed by growing epitaxial layers including the first conductive type semiconductor layer 23, the active layer 25 and the second conductive type semiconductor layer 27 on the substrate 21 by metal organic chemical vapor deposition, followed by patterning the second conductive type semiconductor layer 27 and the active layer 25 such that the first conductive type semiconductor layer 23 is exposed. Side surfaces of the plural mesas M may be obliquely formed by photoresist reflow and the like. An oblique profile of the side surfaces of the mesas M enhances efficiency of extracting light generated in the active layer 25.

The plural mesas M may extend parallel to each other towards one side of the substrate and have a longitudinally elongated shape. Such configuration allows easy formation of the plurality of mesas M having the same shape on a plurality of chip areas on the substrate 21.

After the plurality of mesas is formed, the reflective electrodes 30 may be formed on the mesas M, respectively. However, the present invention is not limited thereto. Alternatively, the reflective electrodes 30 may be formed on the second conductive type semiconductor layer 27 after forming the second conductive type semiconductor layer 27 and before forming the mesas M. The reflective electrode 30 covers most of an upper surface of the corresponding mesa M and has substantially the same shape as that of the mesa M in plan view.

Each of the reflective electrodes 30 may include a reflective layer 28, and may also include a barrier layer 29. The barrier layer 29 may cover an upper surface and a side surface of the reflective layer 28. For example, by forming a pattern of the reflective layer 28 and forming the barrier layer 29 thereon, the barrier layer 29 may be formed to cover the upper surface and the side surface of the reflective layer 28. For example, the reflective layer 28 may be formed through deposition and patterning of Ag, Ag alloys, Ni/Ag, NiZn/Ag or TiO/Ag. On the other hand, the barrier layer 29 may be formed of Ni, Cr, Ti, Pt or combinations thereof, and prevent diffusion or contamination of metallic materials of the reflective layer.

After the plurality of mesas M is formed, an edge of the first conductive type semiconductor layer 23 may also be etched. As a result, the upper surface of the substrate 21 may be exposed. The side surface of the first conductive type semiconductor layer 23 may also be obliquely formed.

Figure 11:
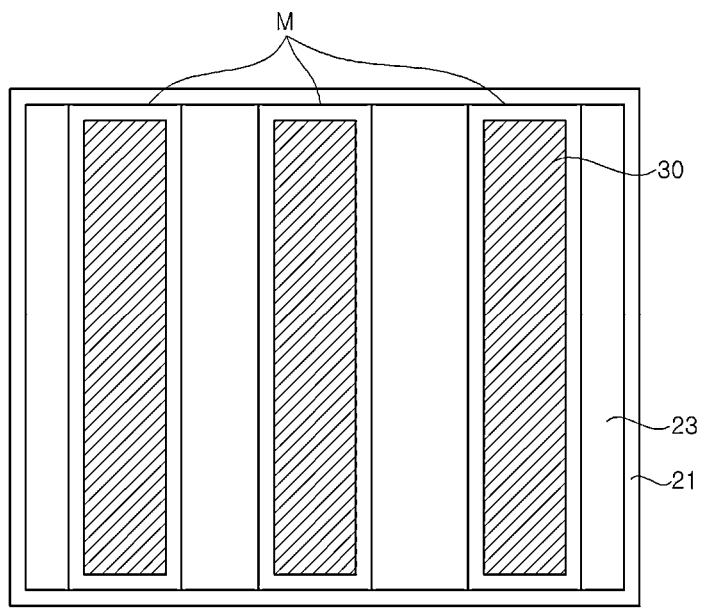
FIG. 11 is a plan view of modification of a mesa structure.

As shown in FIG. 6, the plurality of mesas M may be formed to be disposed only within an upper region of the first conductive type semiconductor layer 23. That is, the plurality of mesas M may be disposed in an island shape on the upper region of the first conductive type semiconductor layer 23. Alternatively, as shown in FIG. 11, the mesas M may extend in one direction to reach an upper edge of the first conductive type semiconductor layer 23. Namely, one edge of a lower surface of each of the mesas M coincides with one edge of the first conductive type semiconductor layer 23 in one direction. Accordingly, the upper surface of the first conductive type semiconductor layer 23 is divided by the plurality of mesas M.

Figure 7:
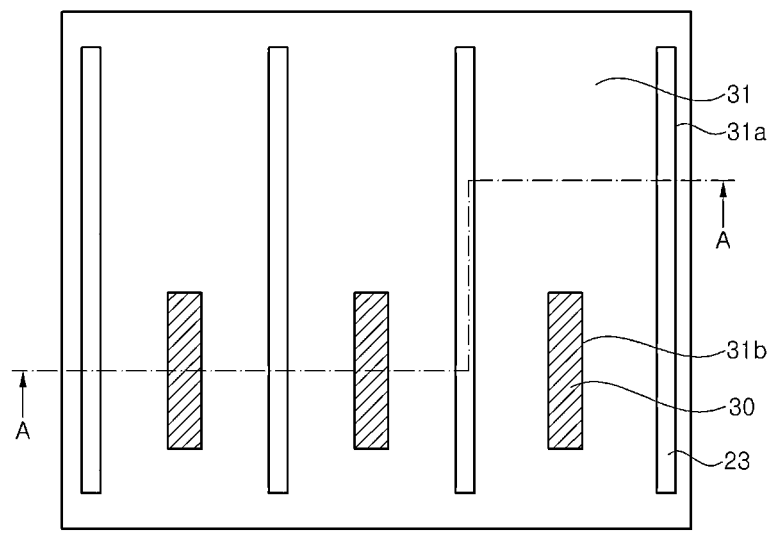
Figure 7:
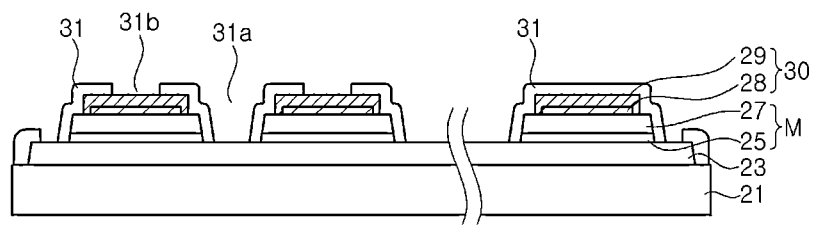

Referring to FIG. 7, a lower insulation layer 31 is formed to cover the plurality of mesas M and the first conductive type semiconductor layer 23. The lower insulation layer 31 has openings 31a, 31b which allow electrical connection to the first conductive type semiconductor layer 23 and the second conductive type semiconductor layer 27 in specific areas. For example, the lower insulation layer 31 may have openings 31a through which the first conductive type semiconductor layer 23 is exposed, and openings 31b through which the reflective electrodes 30 are exposed.

The openings 31a may be disposed in a region between the mesas M and near an edge of the substrate 21, and may have an elongated shape that extends along the mesa M. On the other hand, the openings 31b are disposed only on the mesas M to be biased towards the same ends of the mesas.

The lower insulation layer 31 may be formed as an oxide layer such as $SiO_2$ and the like, a nitride layer such as $SiN_x$ and the like, or an insulation layer such as $MgF_2$, by chemical vapor deposition (CVD) and the like. The lower insulation layer 31 may be formed as a single layer or as multiple layers. Furthermore, the lower insulation layer 31 may be formed as a distributed Bragg reflector (DBR), which is formed by alternately stacking a low refractivity material layer and a high refractivity material layer. For example, the lower insulation layer 31 may be formed as a reflective insulation layer having high reflectivity by stacking $SiO_2/TiO_2$, $SiO_2/Nb_2O_5$, or the like.

Figure 8:
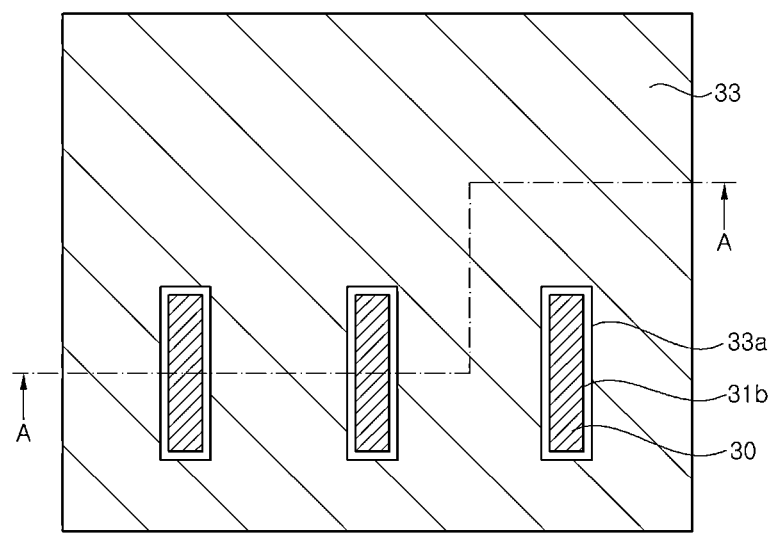
Figure 8:
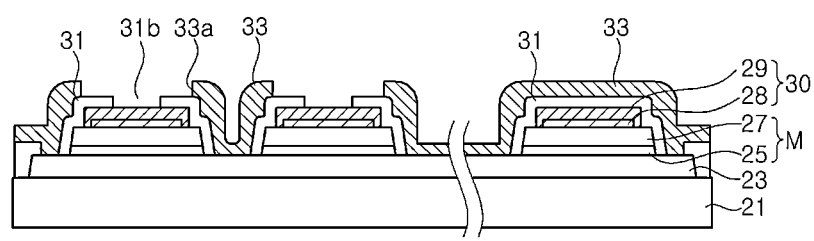

Referring to FIG. 8, a current spreading layer 33 is formed on the lower insulation layer 31. The current spreading layer 33 covers the plurality of mesas M and the first conductive type semiconductor layer 23. Further, the current spreading layer 33 is disposed on an upper region of each of the mesas M, and has the openings 33a through which the reflective electrodes are exposed. The current spreading layer 33 may be in ohmic contact with the first conductive type semiconductor layer 23 through the openings 31a of the lower insulation layer 31. The current spreading layer 33 is isolated from the plurality of mesas M and the reflective electrodes 30 by the lower insulation layer 31.

Each of the openings 33a of the current spreading layer 33 has a larger area than the openings 31b of the lower insulation layer 31 to prevent connection of the current spreading layer 33 to the reflective electrodes 30. Accordingly, the openings 33a have sidewalls disposed on the lower insulation layer 31.

The current spreading layer 33 is formed substantially over the entirety of the upper surface of the substrate 31 excluding the openings 33a. With this structure, current can be easily spread through the current spreading layer 33. The current spreading layer 33 may include a high reflectivity metal layer, such as an Al layer. The high reflectivity metal layer may be formed on a bonding layer of Ti, Cr or Ni. In addition, a protective layer may be formed of Ni, Cr, Au, or combinations thereof as a single layer or a composite layer on the high reflectivity metal layer. The current spreading layer 33 may have, for example, a multilayer structure of Ti/Al/Ti/Ni/Au.

Figure 9:
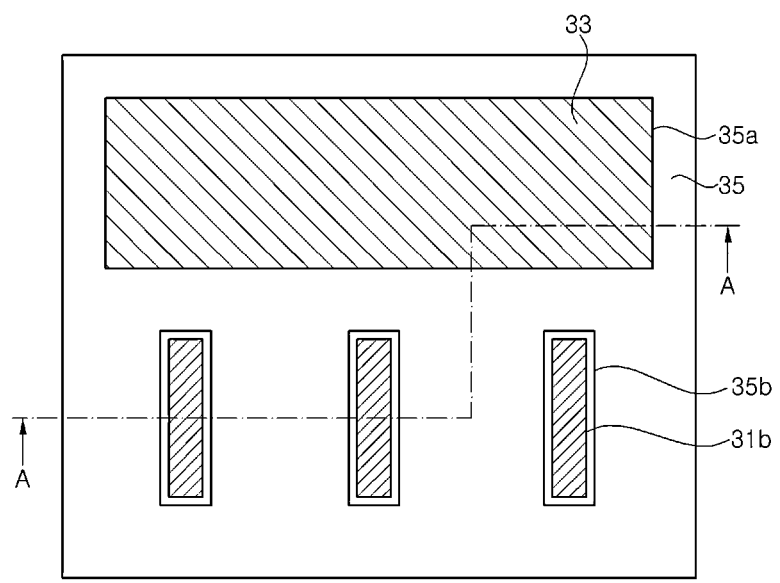
Figure 9:
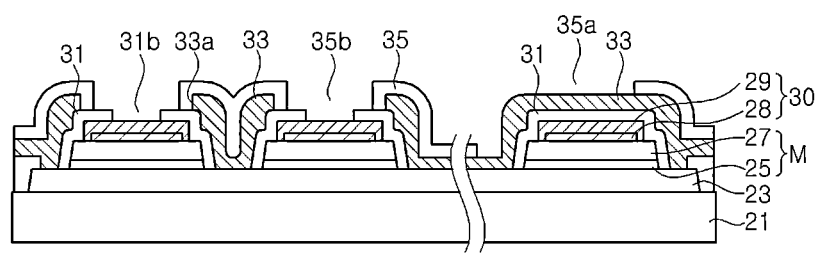

Referring to FIG. 9, an upper insulation layer 35 is formed on the current spreading layer 33. The upper insulation layer 35 has openings 35a through which the current spreading layer 33 is exposed, and openings 35b through which the reflective electrodes 30 are exposed. The openings 35a may have an elongated shape in a perpendicular direction with respect to the longitudinal direction of the mesas M, and a larger area than the openings 35b. The openings 35b expose the reflective electrodes 30, which are exposed through the openings 33a of the current spreading layer 33 and the openings 31b of the lower insulation layer 31. The openings 35b have a narrower area than the openings 33a of the current spreading layer 33 and have a larger area than the openings 31b of the lower insulation layer 31. Accordingly, sidewalls of the openings 33a of the current spreading layer 33 may be covered by the upper insulation layer 35.

The upper insulation layer 35 may be formed of an oxide insulation layer, a nitride insulation layer, or a polymer layer of polyimides, Teflon, Parylene, and the like.

Figure 10:
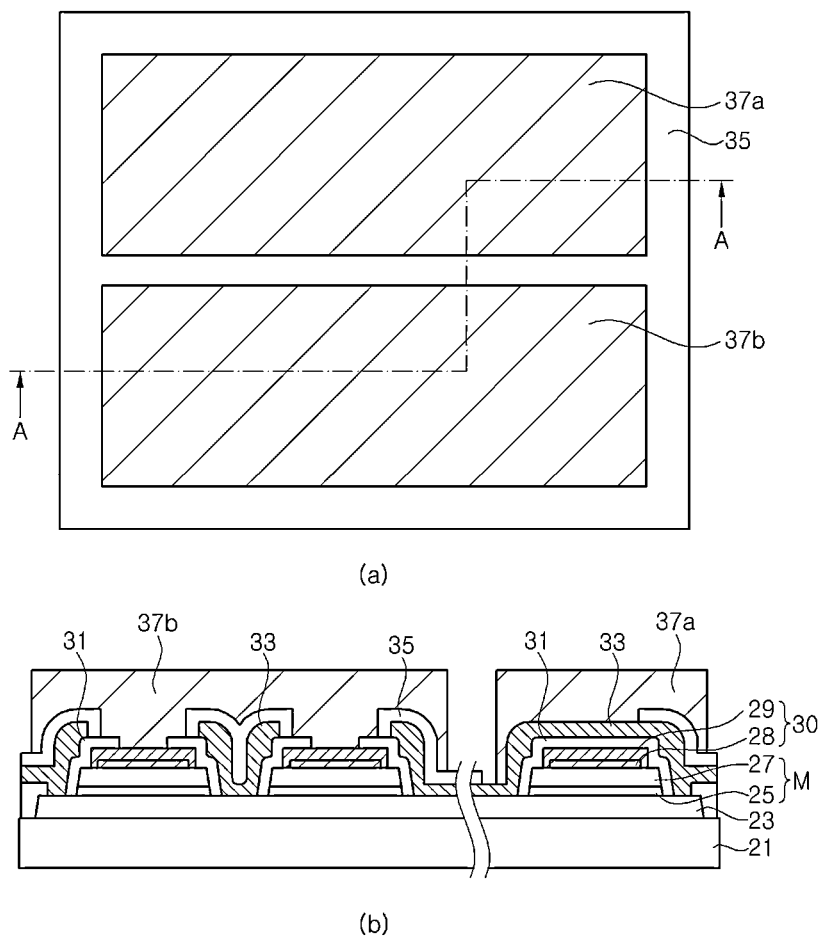

Referring to FIG. 10, a first pad 37a and a second pad 37b are formed on the upper insulation layer 35. The first pad 37a is connected to the current spreading layer 33 through the openings 35a of the upper insulation layer 35, and the second pad 37b is connected to the reflective electrodes 30 through the openings 35b of the upper insulation layer 35. The first pad 37a and the second pad 37b may be used as pads for SMT (Surface-mount technology) or connection of bumps in order to mount the light emitting diode on a sub-mount, a package, a printed circuit board, and the like.

The first and second pads 37a, 37b may be formed at the same time by the same process, for example, photolithography, lift-off, and the like. The first and second pads 37a, 37b may include, for example, a bonding layer of Ti, Cr, Ni, and the like, and a highly conductive metal layer of Al, Cu, Ag, Au, and the like.

Thereafter, the substrate 21 is divided into individual light emitting diode chips, thereby providing final light emitting diodes. The substrate 21 may be removed from the light emitting diode before or after division of the substrate into individual light emitting diode chips.

Next, the structure of the light emitting diode according to the embodiment of the invention will be described in detail with reference to FIG. 10.

The light emitting diode includes the first conductive type semiconductor layer 23, the mesas M, the reflective electrodes 30, and the current spreading layer 33, and the light emitting diode may include the substrate 21, the lower insulation layer 31, the upper insulation layer 35, the first pad 37a, and the second pad 37b.

The substrate 21 may be a growth substrate for growing gallium nitride epitaxial layers, and may be, for example, a sapphire substrate, a carbon nitride substrate, a silicon substrate, or a gallium nitride substrate. In addition, the substrate 21 may be a patterned substrate, as described with reference to FIG. 2.

The first conductive type semiconductor layer 23 is continuously formed and the plural mesas M separated from each other are disposed on the first conductive type semiconductor layer 23. As shown in FIG. 6, each of the mesas M includes the active layer 25 and the second conductive type semiconductor layer 27, and extends towards one side to be parallel to other mesas. Here, the mesas M have a stack of gallium nitride-based compound semiconductors. As shown in FIG. 6, the mesas M may be disposed only within an upper region of the first conductive type semiconductor layer 23. Alternatively, as shown in FIG. 11, the mesas M may extend to an edge of an upper surface of the first conductive type semiconductor layer 23 in one direction, whereby the upper surface of the first conductive type semiconductor layer 23 may be divided into plural areas. As a result, this structure relieves current crowding near corners of the mesas M, thereby improving current spreading performance.

Each of the reflective electrodes 30 is disposed on the corresponding mesa M to be in ohmic contact with the second conductive type semiconductor layer 27. As described with reference to FIG. 6, each of the reflective electrodes 30 may include the reflective layer 28 and the barrier layer 29, which may cover an upper surface and a side surface of the reflective layer 28.

The current spreading layer 33 covers the plurality of mesas M and the first conductive type semiconductor layer 23. The current spreading layer 33 has openings 33a, each of which is disposed within an upper region of each of the mesas M, and through which the reflective electrodes 30 are exposed. In addition, the current spreading layer 33 is in ohmic contact with the first conductive type semiconductor layer 23 and is isolated from the plurality of mesas M. The current spreading layer 33 may include a reflective metal such as Al.

The current spreading layer 33 may be isolated from the plurality of mesas M by the lower insulation layer 31. For example, the lower insulation layer 31 may be disposed between the plurality of mesas M and the current spreading layer 33 to isolate the current spreading layer 33 from the plurality of mesas M. In addition, the lower insulation layer 31 may include openings 31b which are disposed on upper regions of the respective mesas M and through which the reflective electrodes 30 are exposed, and openings 31a through which the first conductive type semiconductor layer 23 is exposed. The current spreading layer 33 may be connected to the first conductive type semiconductor layer 23 through the openings 31a. The openings 31b of the lower insulation layer 31 are narrower than the openings 33a of the current spreading layer 33 and all of the openings 31b are exposed through the openings 33a.

The upper insulation layer 35 covers at least part of the current spreading layer 33. In addition, the upper insulation layer 35 has openings 35b through which the reflective electrodes 30 are exposed. Further, the upper insulation layer 35 may include openings 35a through which the current spreading layer 33 is exposed. The upper insulation layer 35 may cover sidewalls of the openings 33a of the current spreading layer 33.

The first pad 37a may be disposed on the current spreading layer 33, and may be connected to the current spreading layer 33, for example, through the openings 35a of the upper insulation layer 35. In addition, the second pad 37b is connected to the reflective electrodes 30 exposed through the openings 35b.

According to this invention, the current spreading layer 33 covers substantially an overall area of the first conductive type semiconductor layer 23 between the mesas M. As a result, current can be easily spread through the current spreading layer 33.

Furthermore, as the current spreading layer 23 includes the reflective layer formed of a reflective metal such as Al or as the lower insulation layer is formed as a reflective insulation layer, the light emitting diode allows light that is not reflected by the reflective electrodes 30 to be reflected by the current spreading layer 23 or the lower insulation layer 31, thereby improving light extraction efficiency.

On the other hand, when the reflective metal layer 28 and the barrier metal layer 29 of the reflective electrode 30 have a significant difference in coefficient of thermal expansion, stress occurs on the reflective metal layer 28, thereby causing the reflective metal layer 28 to be separated from the mesas M. Accordingly, a stress relieving layer may be interposed between the reflective metal layer 28 and the barrier metal layer 29 to relieve stress due to difference in coefficient of thermal expansion therebetween.

Figure 12:
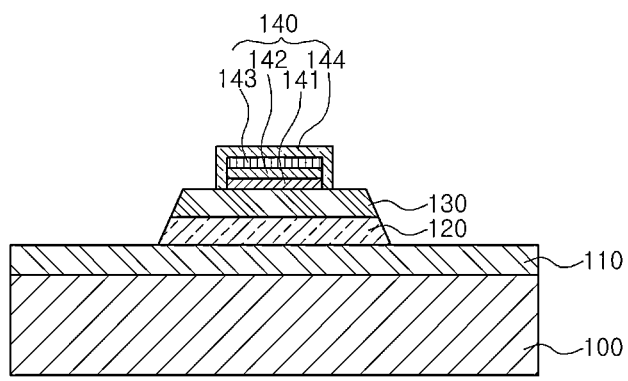
FIG. 12 is a partial sectional view of a light emitting diode having a reflective electrode including a stress relieving layer.

FIG. 12 is a partial sectional view of a light emitting diode having a reflective electrode including a stress relieving layer.

Referring to FIG. 12, a first semiconductor layer 110, an active layer 120, a second semiconductor layer 130, and a reflective electrode 140 are formed on a substrate 100.

The substrate 100 may be any substrate so long as the substrate permits growth of the first semiconductor layer 110 thereon. For example, the substrate 100 may be a sapphire ($Al_2O_3$) substrate, a silicon carbide (SiC) substrate, a gallium nitride (GaN) substrate, an indium gallium nitride (InGaN) substrate, an aluminum gallium nitride (AlGaN) substrate, an aluminum nitride (AlN) substrate, a gallium oxide ($Ga_2O_3$) substrate, or a silicon substrate. Specifically, the substrate 100 may be a sapphire substrate.

In addition, the substrate 100 may be a substrate which is not subjected to surface patterning, or may be a patterned substrate as shown in FIG. 2.

The first semiconductor layer 110 is disposed on the substrate 100. For example, the first semiconductor layer 110 may be an n-type conductive type semiconductor layer.

In addition, the active layer 120 formed on the first semiconductor layer 110 may have a single quantum well structure in which a well layer and a barrier layer are stacked, or may be a multi-quantum well structure in which well layers and barrier layers are alternately stacked one above another.

The second semiconductor layer 130 is disposed on the active layer 120. For example, the second semiconductor layer 130 may be a p-type conductive type semiconductor layer.

Further, the first semiconductor layer 110, the active layer 120, and the second semiconductor layer 130 may include GaN, AlN, InGaN or AlInGaN. If the first semiconductor layer 110 includes GaN, it is desirable that the active layer 120 and the second semiconductor layer 130 also include GaN.

Here, since the second semiconductor layer 130 has a conductive type in complementary relation with the first semiconductor layer 110, the second semiconductor layer 130 is implanted with different types of dopants than those of the first semiconductor layer 110. Specifically, when dopants having donor functions are implanted into the first semiconductor layer 110, dopants having acceptor functions are implanted in the second semiconductor layer 130. Further, the active layer 120 preferably includes a material capable of creating a band gap for formation of the barrier layer and the well layer.

The reflective electrode 140 is formed on the second semiconductor layer 130.

The reflective electrode 140 includes an ohmic connection layer 141, a reflective metal layer 142, a stress relieving layer 143, and a barrier metal layer 144.

The ohmic connection layer 141 may be formed of any material capable of achieving ohmic contact between the reflective metal layer 142 and the second semiconductor layer 130. Thus, the ohmic connection layer 141 may include a metal including Ni or Pt, and may also include a conductive oxide such as ITO, ZnO, and the like. In some embodiments, the ohmic connection layer 141 may be omitted.

The reflective metal layer 142 is formed on the ohmic connection layer 141. The reflective metal layer 142 reflects light generated in the active layer 120. Accordingly, the reflective metal layer is formed of a material having high conductivity and high reflectivity with respect to light. The reflective metal layer 142 may include Ag, Ag alloys, Al or Al alloys.

Further, the stress relieving layer 143 is formed on the reflective metal layer 142. The stress relieving layer 143 has a coefficient of thermal expansion, which is greater than or equal to the coefficient of thermal expansion of the barrier metal layer 144 and is lower than or equal to the coefficient of thermal expansion of the reflective metal layer 142. With this structure, stress caused by difference in coefficient of thermal expansion between the reflective metal layer 142 and the barrier metal layer 144 can be relieved. Accordingly, the material of the stress relieving layer 143 is selected depending on the materials of the reflective metal layer 142 and the barrier metal layer 144.

The barrier metal layer 144 is formed on the stress relieving layer 143. The barrier metal layer 144 is formed to surround at least a side surface of the reflective metal layer 142 while surrounding an upper portion and a side surface of the stress relieving layer 142. With this structure, it is possible to prevent diffusion of metal elements or ions constituting the reflective metal layer 142. Further, stress caused by difference in coefficient of thermal expansion between the reflective metal layer 142 and the barrier metal layer 144 is absorbed by the stress relieving layer 143.

For example, when the reflective metal layer 142 includes Al or Al alloys and the barrier metal layer 144 includes W, TiW or Mo, the stress relieving layer 143 may be formed as a single layer of Ag, Cu, Ni, Pt, Ti, Rh, Pd or Cr, or as a composite layer of Cu, Ni, Pt, Ti, Rh, Pd or Au. In addition, when the reflective metal layer 142 includes Al or Al alloys and the barrier metal layer 144 includes Cr, Pt, Rh, Pd or Ni, the stress relieving layer 143 may be formed as a single layer of Ag or Cu or as a composite layer of Ni, Au, Cu or Ag.

In addition, when the reflective metal layer 142 includes Ag or Ag alloys and the barrier metal layer 144 includes W, TiW or Mo, the stress relieving layer 143 may be formed as a single layer of Cu, Ni, Pt, Ti, Rh, Pd or Cr, or as a composite layer of Cu, Ni, Pt, Ti, Rh, Pd, Cr or Au. Further, when the reflective metal layer 142 includes Ag or Ag alloys and the barrier metal layer 144 includes Cr or Ni, the stress relieving layer 143 may be formed as a single layer of Cu, Cr, Rh, Pd, TiW or Ti, or as a composite layer of Ni, Au or Cu.

FIG. 13 to FIG. 18 are sectional views illustrating a method of manufacturing the light emitting diode shown in FIG. 12, in accordance with one embodiment of the present invention.

Figure 13:
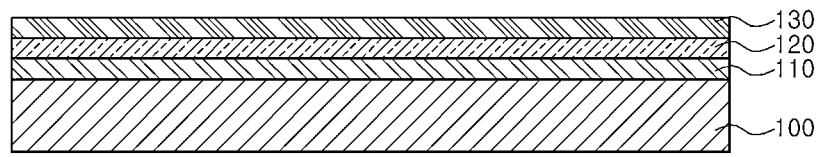
FIG. 13 to FIG. 18 are sectional views illustrating a method of manufacturing the light emitting diode shown in FIG. 12, in accordance with one embodiment of the present invention.

Referring to FIG. 13, a first semiconductor layer 110, an active layer 120 and a second semiconductor layer 130 are sequentially formed on a substrate 100 to form a semiconductor stack.

The substrate 100 may be formed of sapphire ($Al_2O_3$), silicon carbide (SiC), gallium nitride (GaN), indium gallium nitride (InGaN), aluminum gallium nitride (AlGaN), aluminum nitride (AlN), gallium oxide ($Ga_2O_3$), or silicon. Specifically, the substrate 100 may be a sapphire substrate. Further, the substrate 100 may be a patterned substrate, as shown in FIG. 2.

Further, the first semiconductor layer 110 is formed on the substrate 100. The first semiconductor layer 110 may be an n-type conductive type semiconductor layer.

In addition, the active layer 120 formed on the first semiconductor layer 110 may have a single quantum well structure in which a well layer and a barrier layer are stacked, or may be a multi-quantum well structure in which well layers and barrier layers are alternately stacked one above another The second semiconductor layer 130 is disposed on the active layer 120. The second semiconductor layer 130 may be a p-type conductive type semiconductor layer Further, the first semiconductor layer 110, the active layer 120, and the second semiconductor layer 130 are the same as those described with reference to FIG. 12 in terms of materials and configuration, and detailed descriptions thereof will be omitted.

Further, the first semiconductor layer 110, the active layer 120, and the second semiconductor layer 130 are formed through epitaxial growth. For example, the first semiconductor layer 110, the active layer 120, and the second semiconductor layer 130 may be formed through metal organic chemical vapor deposition (MOCVD).

Figure 14:
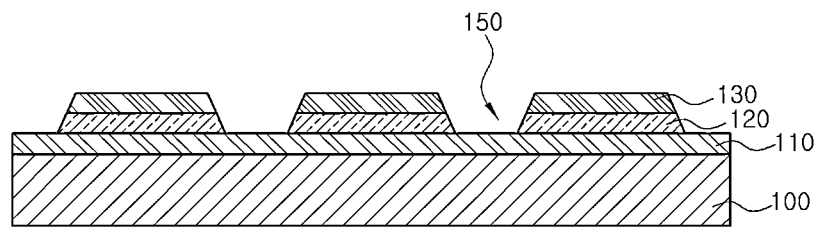

Referring to FIG. 14, part of the active layer 120 and part of the second semiconductor layer 130 are removed by typical etching. As a result, the first semiconductor layer 110 is partially exposed. Through the etching process, an upper surface of the first semiconductor layer 110 is exposed, and side surfaces of the active layer 120 and the second semiconductor layer 130 are exposed. As a result, the active layer 120 and the second semiconductor layer 130 are partially removed to form trenches and holes through the etching process. In other words, the mesa-etched areas 150 formed from the surface of the second semiconductor layer 130 of FIG. 13 to the surface of the first semiconductor layer 110 may be a trench-shaped stripe type or a hole type.

In addition, when the mesa-etched areas 150 are formed in a stripe type, a perpendicular profile or an oblique profile may be formed from the surface of the first semiconductor layer 110. Preferably, an oblique profile slanted at an angle of 20° to 70° from the surface of the first semiconductor layer 110 is provided. In addition, when the mesa-etched areas 150 are formed in a hole type of a substantially circular shape, a perpendicular profile or an oblique profile may be formed from the surface of the first semiconductor layer 110. Preferably, an oblique profile slanted at an angle of 20° to 70° from the surface of the first semiconductor layer 110 is provided. If the profile has an angle of less than 20°, a distance between the mesa-etched areas 150 significantly increases in an upward direction. In this case, there is a problem of deterioration in concentration of light generated by a light emitting structure. Further, if the profile has an angle of greater than 70°, the mesa-etched areas 150 have a substantially perpendicular profile. In this case, reflection of light by sidewalls of the mesa-etched areas becomes insignificant.

Figure 15:
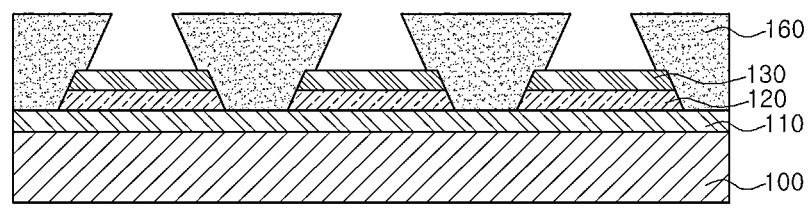

Referring to FIG. 15, a photoresist pattern 160 is formed on exposed areas of the first semiconductor layer 110, which are exposed to the mesa-etched areas 150. The first semiconductor layer 110 constitutes lower surfaces of the mesa-etched areas 150. The photoresist pattern 160 may have a perpendicular profile from the surface of the first semiconductor layer 110, and may be formed in an overhang structure, a lower surface of which has a narrower width than an upper surface thereof, according to implementation. The photoresist pattern 160 may be formed using a negative type photoresist. Accordingly, the exposed portion has cross-linked characteristics. To form an overhang structure, the photoresist pattern 160 is preferably subjected to exposure at a predetermined inclination. For the overhang structure, a separation between lower surfaces of the photoresist pattern 160 may be greater than a separation between upper surfaces thereof by a distance of 1 µm or more.

Figure 16:
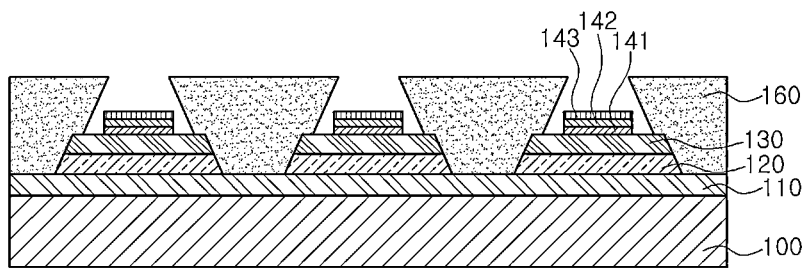

Referring to FIG. 16, a reflective metal layer 142 and a stress relieving layer 143 are sequentially stacked on the second semiconductor layer 130.

The reflective metal layer 142 includes Al, Al alloys, Ag or Ag alloys. The reflective metal layer 142 may be formed through typical metal deposition. Preferably, the reflective metal layer 142 is formed by e-beam evaporation, by which most metal elements or ions can be moved onto the surface of the second semiconductor layer 130 in a perpendicular direction. By this process, the metal elements or ions are introduced in an anisotropic manner into a space between the photoresist patterns 160 to form the reflective metal layer 142.

The reflective metal layer 142 preferably has a thickness of 100 nm to 1 µm. If the thickness of the reflective metal layer 142 is less than 100 nm, there is a problem of inefficient reflection of light generated in the active layer 120. On the other hand, if the thickness of the reflective metal layer 142 is greater than 1 µm, there is a problem of processing loss due to excess processing time.

Optionally, an ohmic connection layer 141 may be formed. The ohmic connection layer 141 may include Ni, Pt, ITO, or ZnO. In addition, the ohmic connection layer 141 may have a thickness of 0.1 nm to 20 nm. If the thickness of the ohmic connection layer 141 is less than 0.1 nm, it is difficult to secure sufficient ohmic characteristics due to a very thin thickness. If the thickness of the ohmic connection layer is greater than 20 nm, there is a problem of reduction in amounts of light reflected by the reflective metal layer 142 due to reduction in transmission amount of light.

A stress relieving layer 143 is formed on the reflective metal layer 142. The stress relieving layer 143 may be formed through a typical metal deposition process. Preferably, e-beam evaporation exhibiting high directionality is used. In other words, metal elements or ions evaporated by electron beams have directionality and anisotropy in the space between the photoresist patterns 160, and form a metal layer. Further, the stress relieving layer 143 has a coefficient of thermal expansion which is lower than that of the reflective metal layer 142 and higher than that of the barrier metal layer 144 of FIG. 12. Accordingly, the material of the stress relieving layer 143 may be selected depending upon the materials of the reflective metal layer 142 and the barrier metal layer 144. The material of the stress relieving layer 143 will be described below.

When the reflective metal layer 142 and the stress relieving layer 143 are formed by e-beam evaporation, side surfaces of the reflective metal layer 142 and the stress relieving layer 143 are exposed. In addition, the reflective metal layer 142 and the stress relieving layer 143 are formed corresponding to open upper regions of the photoresist pattern 160 by anisotropic deposition.

Further, in FIG. 16, a metal deposition formed on the photoresist pattern 160 during formation of the reflective metal layer 142 and the stress relieving layer 143 is omitted.

Figure 17:
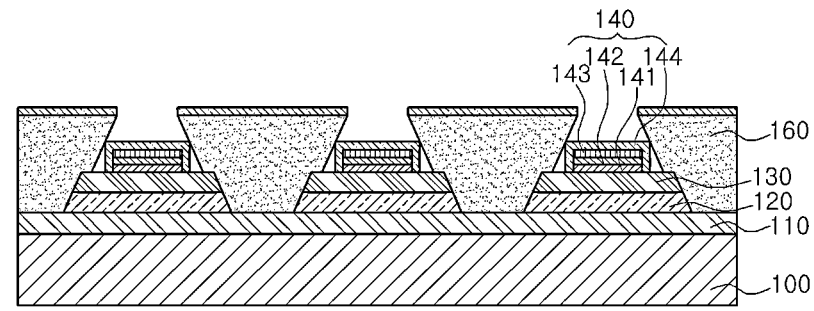

Referring to FIG. 17, a barrier metal layer 144 is formed through the open areas of the photoresist pattern 160.

The barrier metal layer 144 includes W, TiW, Mo, Cr, Ni, Pt, Rh, Pd or Ti. Specifically, the material of the barrier metal layer 144 is selected dependent upon the material of the reflective metal layer 142 and the stress relieving layer 143.

The barrier metal layer 144 is formed on the stress relieving layer 143 and shields the side surfaces of the reflective metal layer 142 and the stress relieving layer 143. With this structure, it is possible to prevent diffusion of metal elements constituting the reflective metal layer 142 into the second semiconductor layer 130 through the side surfaces thereof. The barrier metal layer 144 is formed through typical metal deposition. Here, the barrier metal layer 144 is preferably formed through isotropic deposition. This is because the barrier metal layer 144 surrounds the side surfaces of the stress relieving layer 143 and the reflective metal layer 142. For example, the barrier metal layer 144 may be formed by sputtering.

In addition, the barrier metal layer 144 may be formed of a specific metal to have a single layer of 100 nm or more. Further, the barrier metal layer 144 may be formed by alternately stacking two or more metal layers each having a thickness of 20 nm or more one above another. For example, the barrier metal layer 144 may be formed by alternately stacking a TiW layer having a thickness of 50 nm and a Ni or Ti layer having a thickness of 50 nm.

Further, Ni/Au/Ti layers may be additionally formed on the barrier metal layer 144 to secure stable contact with subsequent materials.

As described above, the material of the stress relieving layer 143 is selected depending upon the materials of the reflective metal layer 142 and the barrier metal layer 144. This is because the stress relieving layer 143 has a coefficient of thermal expansion that is higher than that of the barrier metal layer 144 and lower than that of the reflective metal layer 142. Thus, when the reflective metal layer 142 includes Al or Al alloys and the barrier metal layer 144 includes W, TiW or Mo, the stress relieving layer 143 is formed as a single layer of Ag, Cu, Ni, Pt, Ti, Rh, Pd or Cr, or as a composite layer of Cu, Ni, Pt, Ti, Rh, Pd or Au.

Further, when the reflective metal layer 142 includes Al or Al alloys and the barrier metal layer 144 includes Ti, Cr, Pt, Rh, Pd or Ni, the stress relieving layer 143 may be a single layer of Ag or Cu or as a composite layer of Ni, Au, Cu or Ag. Further, when the reflective metal layer 142 includes Ag or Ag alloys and the barrier metal layer 144 includes W, TiW or Mo, the stress relieving layer 143 is formed as a single layer of Cu, Ni, Pt, Ti, Rh, Pd or Cr, or as a composite layer of Cu, Ni, Pt, Ti, Rh, Pd, Cr or Au. Further, when reflective metal layer 142 includes Ag or Ag alloys and the barrier metal layer 144 includes Pt or Ni, the stress relieving layer 143 is formed as a single layer of Cu, Cr, Rh, Pd, TiW or Ti, or as a composite layer of Ni, Au or Cu.

Figure 18:
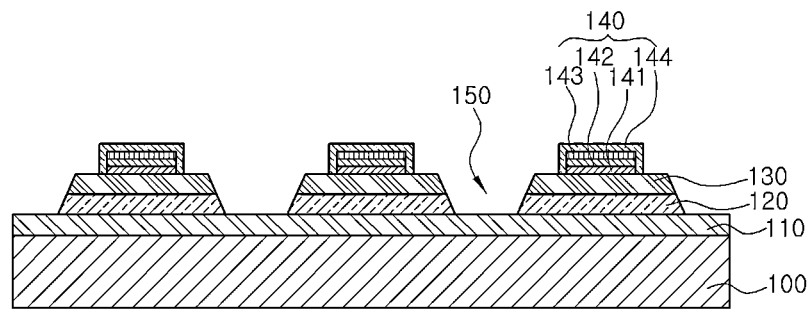

Referring to FIG. 18, the photoresist pattern is removed by a lift-off process. As a result, the first semiconductor layer 130 at a lower side and reflective electrodes 140 at an upper side are exposed. In addition, the mesa-etched areas 150 are exposed through removal of the photoresist pattern. As described above, the mesa-etched areas 150 may be formed in a stripe type or hole type.

Through the above process, the reflective electrodes 140 are formed on the second semiconductor layer 130. Each of the reflective electrodes 140 includes the reflective metal layer 142, the stress relieving layer 143 and the barrier metal layer 144. The stress relieving layer 143 has a coefficient of thermal expansion that is lower than that of the reflective metal layer 142 and higher than that of the barrier metal layer 143. Accordingly, stress caused by difference in coefficient of thermal expansion between the reflective metal layer 142 and the barrier metal layer 144 is absorbed by the stress relieving layer 143.

FIG. 19 to FIG. 23 are plan views and sectional views illustrating a method of manufacturing the light emitting diode having the structure of FIG. 12 in accordance with another embodiment of the present invention.

Figure 19:
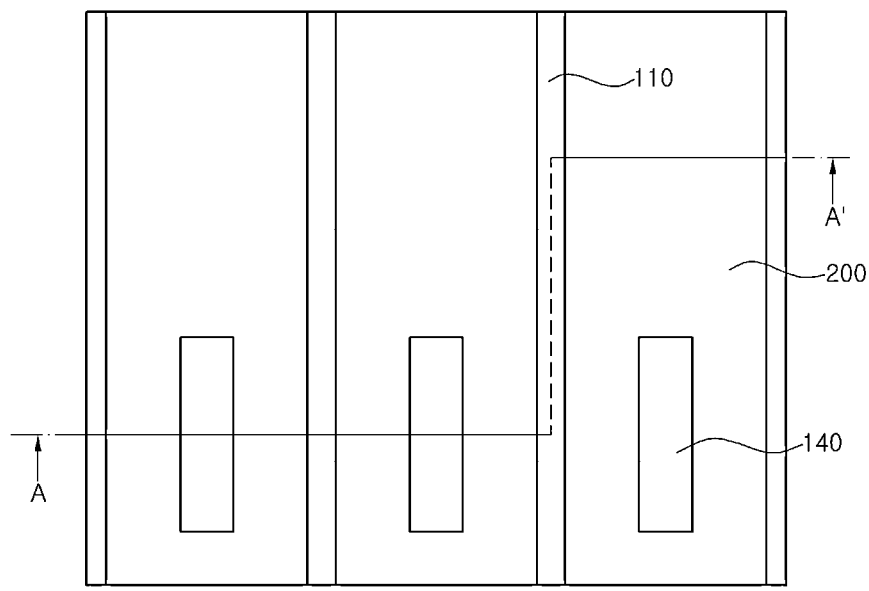
FIG. 19 to FIG. 23 are plan views and sectional views illustrating a method of manufacturing the light emitting diode having the structure of FIG. 12 in accordance with another embodiment of the present invention.
Figure 19:
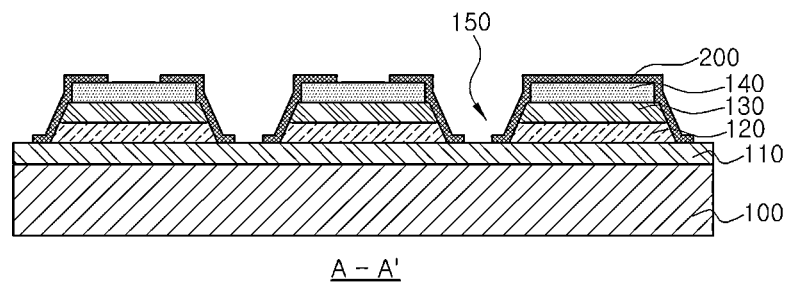

Referring to FIG. 19, it is assumed that the mesa-etched areas 150 of FIG. 18 have a stripe shape. Then, a lower insulation layer 200 is formed on an overall surface of the structure shown in FIG. 18. The lower insulation layer 200 allows an upper surface of the reflective electrode 140 to be partially exposed therethrough while allowing a surface of the first semiconductor layer 130 to be exposed therethrough. To form the lower insulation layer 200, an oxide layer such as $SiO_2$ and the like, a nitride layer such as $SiN_x$ and the like, an insulation layer such as $MgF_2$, or a DBR (distributed Bragg reflector) of $SiO_2/TiO_2$, and the like is formed on the structure of FIG. 18. Thereafter, part of the reflective electrodes 140 and the surface of the first semiconductor layer 110 are exposed by typical photolithography.

In FIG. 19, a lower figure is a sectional view taken along line A-A' of the plan view of FIG. 19. In this sectional view, line A-A' is discontinuous and a portion depicted by a dotted line is not shown. In this regard, it should be noted that a discontinuous line is illustrated as a continuous line in the sectional view. This is also applied to FIG. 21.

Further, although three reflective electrodes 140 are exposed in this embodiment, it should be understood that this structure is provided for illustration only, and the number of exposed reflective electrodes 140 can be changed, as needed.

In some areas, the reflective electrodes 140 are exposed, and in the mesa-etched areas 150, the first semiconductor layer 110 is exposed. Further, in a region where the reflective electrodes 140 are not exposed, the lower insulation layer 200 completely shields the reflective electrodes 140.

Figure 20:
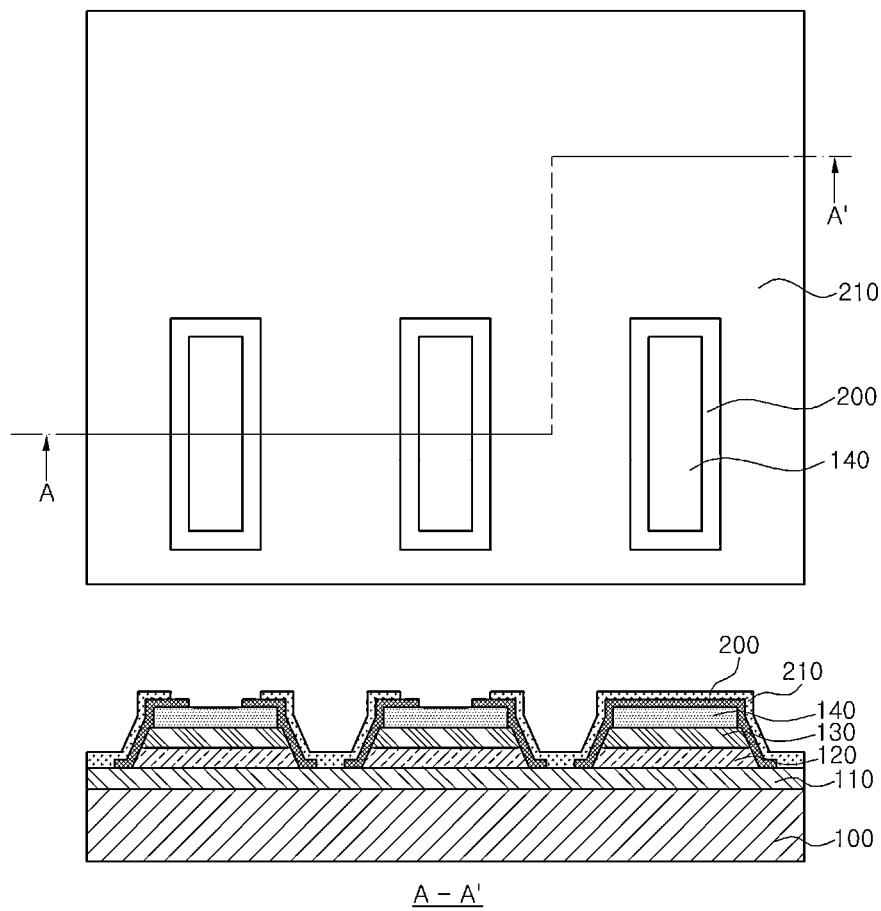

Referring to FIG. 20, the current spreading layer 210 is formed on the lower insulation layer 200. The current spreading layer 210 is formed of a conductive material. Further, the current spreading layer 210 exposes part of the reflective electrodes 140.

The current spreading layer 210 may include Al. As a result, the first semiconductor layer 110 and the current spreading layer 210 are electrically connected to each other, and the reflective electrodes 140 are electrically isolated from the current spreading layer 210 by the lower insulation layer 200.

This can be confirmed through a lower sectional view. Specifically, in the sectional view taken along line A-A', two reflective electrodes 140 are exposed in a portion intersecting the two exposed reflective electrodes 140, and in a portion taken along a line intersecting a region buried only by the incurrent spreading layer 210, the lower insulation layer 200 is formed on the reflective electrodes 140 and the current spreading layer 210 is formed on the lower insulation layer 200. Further, in FIG. 19, the current spreading layer 210 is formed on the surface of the first semiconductor layer 110 exposed in a stripe shape.

Since the current spreading layer 210 includes Al, it is possible to reflect light generated in the active layer. Accordingly, the current spreading layer 210 acts as a reflective layer for reflecting light while achieving electrical connection to the first semiconductor layer 110.

Before formation of the current spreading layer 210, a separate bonding layer having the same shape as that of the current spreading layer 210 may be formed. The bonding layer includes Ti, Cr or Ni. The bonding layer facilitates ohmic connection between the current spreading layer 210 and the first semiconductor layer 110.

Further, a passivation layer may be formed on the current spreading layer 210. The passivation layer may be a single layer of Ni, Cr or Au, or a composite layer thereof. The passivation layer is preferably a composite layer of Ti/Al/Ti/Ni/Au.

Figure 21:
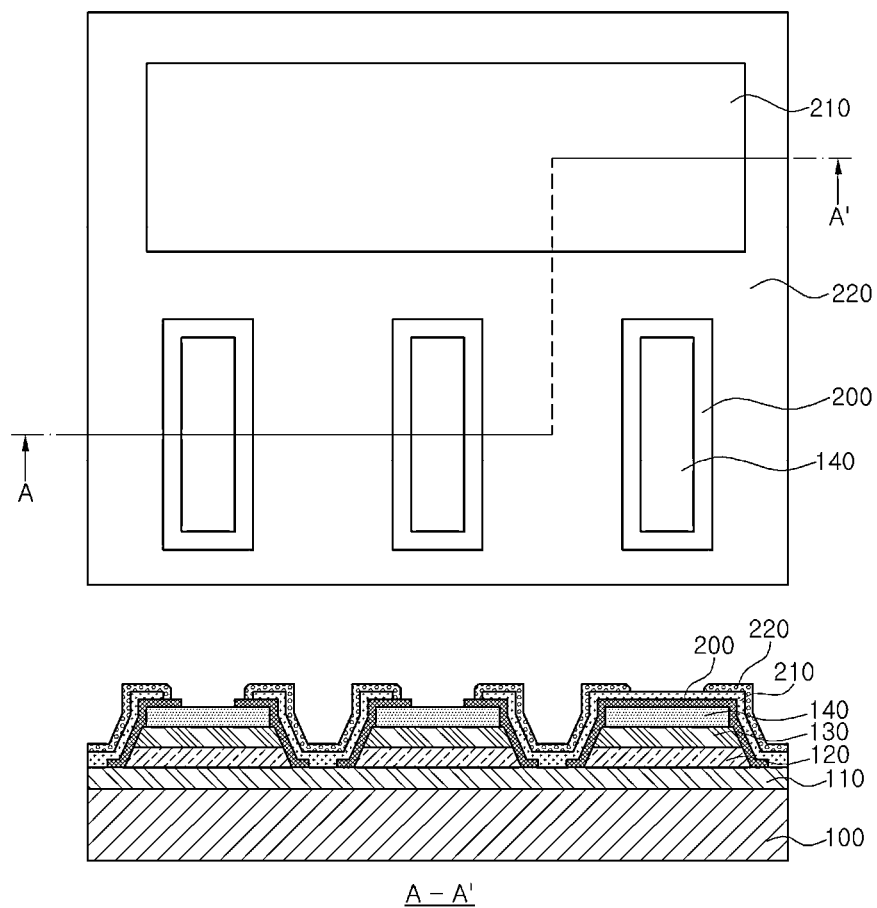

Referring to FIG. 21, an upper insulation layer 220 is formed on the structure of FIG. 20. Both the current spreading layer 210 and the reflective electrode 140 are partially exposed through the upper insulation layer 220. The reflective electrodes 140 are electrically connected to the second semiconductor layer 130, and the current spreading layer 210 is electrically connected to the first semiconductor layer 110. Thus, an electric path between the first semiconductor layer 110 and the second semiconductor layer 130 is open through the upper insulation layer 220.

The upper insulation layer 220 may be formed of any insulation material, for example, oxide insulation materials, nitride insulation materials, polymers such as polyimide, Teflon, Parylene, and the like.

Figure 22:
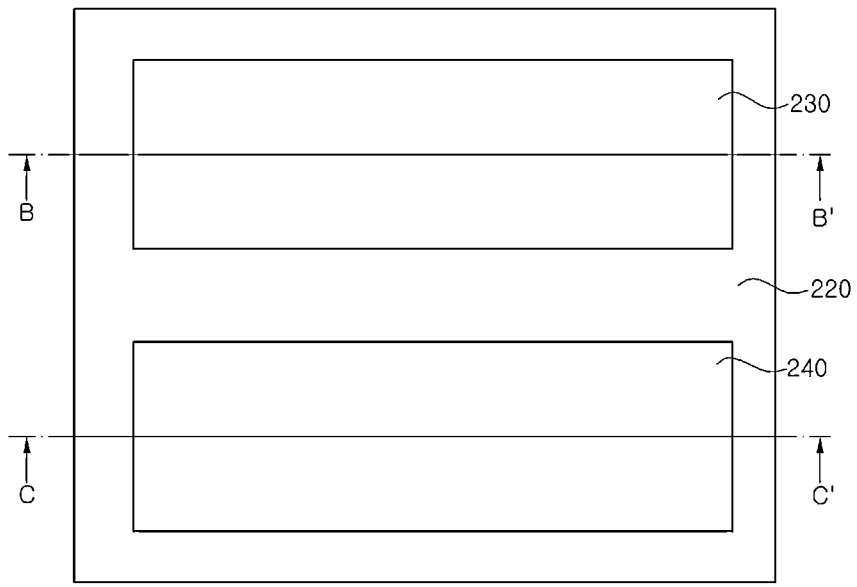

Referring to FIG. 22, a first pad 230 and a second pad 240 are formed on the structure of FIG. 21. The first pad 230 is electrically connected to the current spreading layer 210 exposed in FIG. 21. Accordingly, the first pad 230 is electrically connected to the first semiconductor layer 110. This means that the first semiconductor layer 110 is electrically connected to an external power source or power supply through the first pad 230. Further, the second pad 240 is electrically connected to the reflective electrodes 140 exposed in FIG. 21. Thus, the second pad 240 is electrically connected to the second semiconductor layer 130. This means that the second semiconductor layer 130 is electrically connected to an external power source or power supply through the second pad 240.

The first pad 230 and the second pad 240 may be formed as a double-layer structure including a layer of Ti, Cr or Ni and a layer of Al, Cu, Ag or Au. In addition, the first pad 230 and the second pad 240 may be formed by patterning a photoresist, depositing a metal into a space between patterned areas, followed by a lift-off process for removing the photoresist pattern. Alternatively, after forming a double-layer or single layer metal film, a pattern may be formed through typical photolithography, and used as an etching mask to form the first pad and the second pad through dry etching or wet etching. Here, the etchant for dry etching and wet etching may vary depending upon the kind of metal to be etched.

Figure 23:
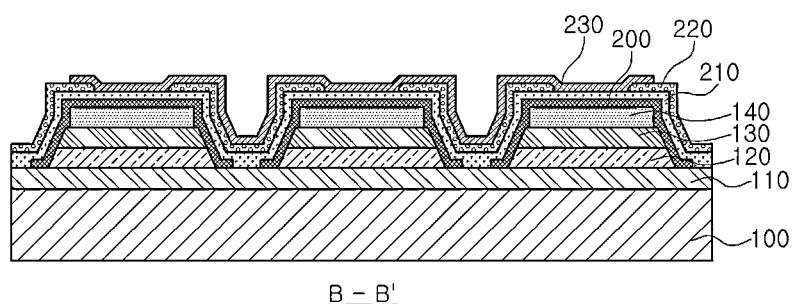
Figure 23:
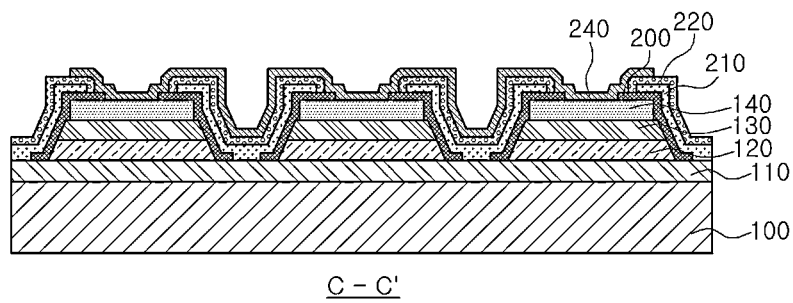

FIG. 23 shows a sectional view taken along line B-B' of FIG. 22 and a sectional view taken along line C-C' of FIG. 22.

First, line B-B' corresponds to a region in which the first pad 230 is formed. The first pad 230 is electrically connected to the exposed current spreading layer 210.

Next, line C-C' corresponds to a region in which the second pad 240 is formed. The second pad 240 is electrically connected to the exposed reflective electrode 140.

As a result, it can be seen that the first pad 230 is electrically connected to the semiconductor layer 110 and the second pad 240 is electrically connected to the second semiconductor layer 130.

Figure 24:
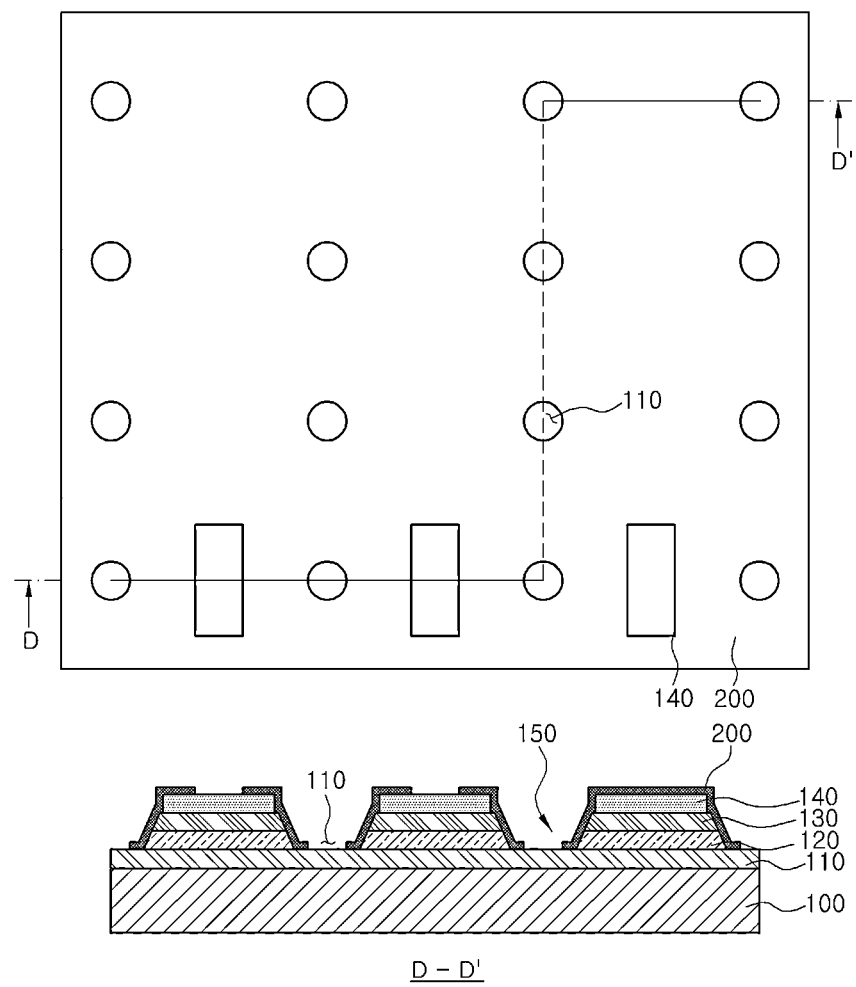
FIG. 24 to FIG. 26 are plan views and sectional views illustrating a method of manufacturing the light emitting diode having the structure of FIG. 12 in accordance with a further embodiment of the present invention.
Figure 25:
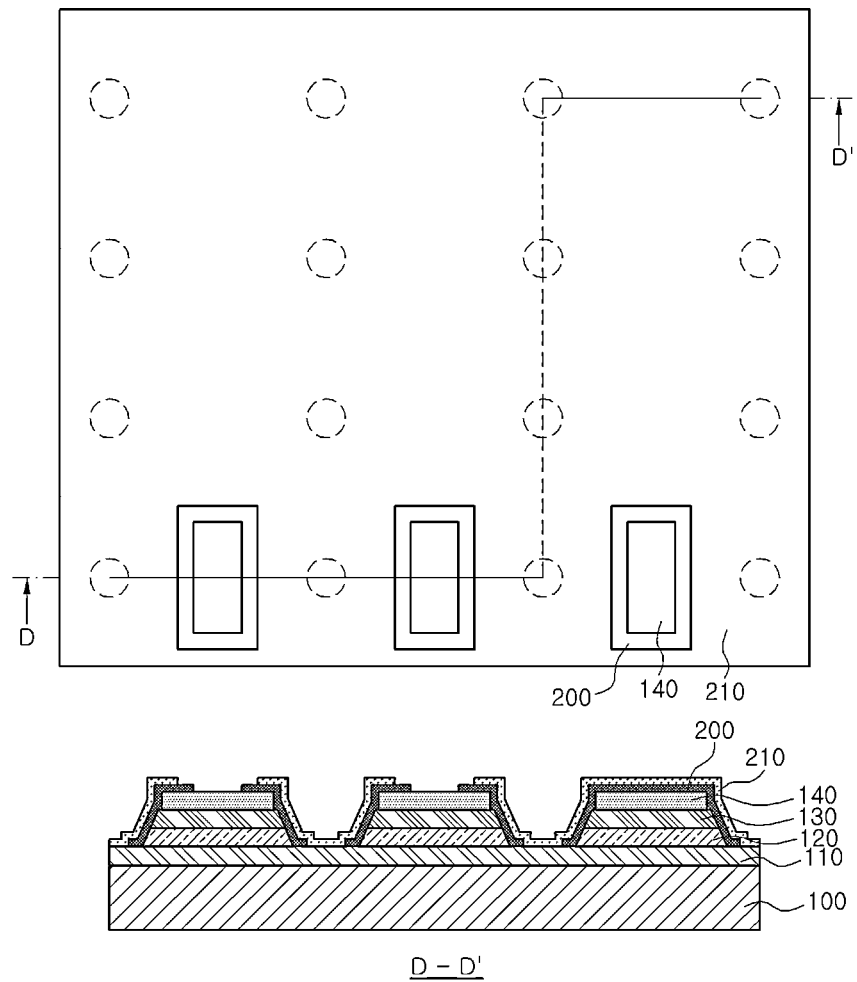
Figure 26:
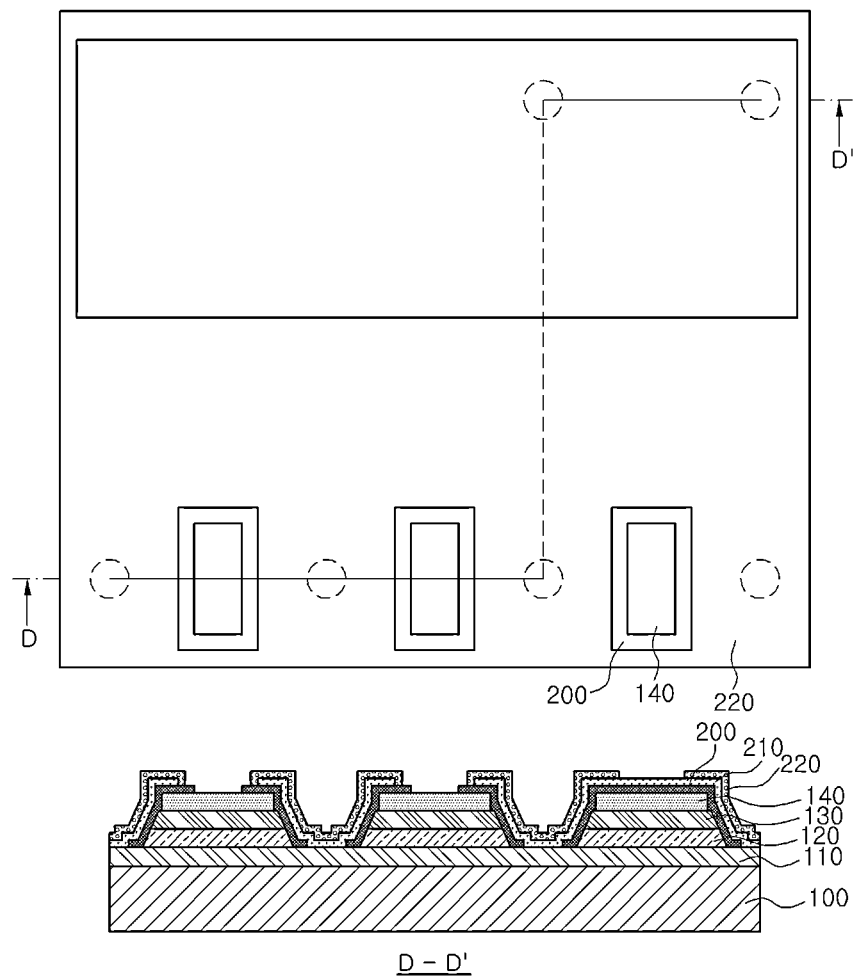

FIG. 24 to FIG. 26 are plan views and sectional views illustrating a method of manufacturing the light emitting diode having the structure of FIG. 12 in accordance with a further embodiment of the present invention.

FIG. 24 to FIG. 26 are plan views and sectional views of a light emitting diode module having the structure of FIG. 12 in accordance with a fourth embodiment of the invention.

Referring to FIG. 24, in this embodiment, mesa-etched areas 150 of FIG. 18 are formed in a hole type. Accordingly, a first semiconductor layer 110 is exposed in a substantially circular shape.

Next, a lower insulation layer 200 is formed on an overall surface of the structure of FIG. 18. The lower insulation layer 200 exposes part of an upper surface of each of the reflective electrodes 140 while exposing a surface of the first semiconductor layer 110. The lower insulation layer 200 is formed in the same manner as in FIG. 19, and detailed descriptions thereof will be omitted.

In FIG. 24, a lower figure is a sectional view taken along line D-D' of the plan view of FIG. 24. In this sectional view, line D-D' is discontinuous along a dotted line and is provided by connecting solid lines. Thus, the sectional view does not include a dotted line section and shows only a solid line section.

In some areas, the reflective electrodes 140 are exposed, and in the mesa-etched areas 150, the first semiconductor layer 110 is exposed. Further, in a region where the reflective electrodes 140 are not exposed, the lower insulation layer 200 completely shields the reflective electrodes 140.

Further, in FIG. 24, the hole type mesa-etched areas 150 are exaggerated for convenience in description. Thus, the number and shape of the hole type mesa-etched areas 150 may vary according to implementation.

Referring to FIG. 25, a current spreading layer 210 is formed on the lower insulation layer 200. The current spreading layer 210 is formed of a conductive material. In addition, the current spreading layer 210 exposes part of the reflective electrodes 140.

The current spreading layer 210 may include Al. As a result, the first semiconductor layer 110 and the current spreading layer 210 are electrically connected to each other, and the reflective electrodes 140 are electrically isolated from the current spreading layer 210 by the lower insulation layer 200.

This can be confirmed through a lower sectional view. Specifically, in the sectional view taken along line D-D', two reflective electrodes 140 are exposed in a portion intersecting the two exposed reflective electrodes 140, and in a portion taken along line intersecting a region buried only by the incurrent spreading layer 210, the lower insulation layer 200 is formed on the reflective electrodes 140 and the current spreading layer 210 is formed on the lower insulation layer 200. Further, in FIG. 25, the current spreading layer 210 is formed on the surface of the first semiconductor layer 110 exposed in a hole shape.

Since the current spreading layer 210 includes Al, it is possible to reflect light generated in the active layer. Accordingly, the current spreading layer 210 acts as a reflective layer for reflecting light while achieving electrical connection to the first semiconductor layer 110.

Before formation of the current spreading layer 210, a separate bonding layer having the same shape as that of the current spreading layer 210 may be formed. The bonding layer includes Ti, Cr or Ni. The bonding layer facilitates ohmic connection between the current spreading layer 210 and the first semiconductor layer 110.

Further, a passivation layer may be formed on the current spreading layer 210. The passivation layer may be a single layer of Ni, Cr or Au, or a composite layer thereof. The passivation layer is preferably a composite layer of Ti/Al/Ti/Ni/Au.

Referring to FIG. 26, an upper insulation layer 220 is formed on the structure of FIG. 25. Both the current spreading layer 210 and the reflective electrode 140 are partially exposed through the upper insulation layer 220. The reflective electrodes 140 are electrically connected to the second semiconductor layer 130, and the current spreading layer 210 is electrically connected to the first semiconductor layer 110. Thus, an electric path between the first semiconductor layer 110 and the second semiconductor layer 130 is open through the upper insulation layer 220.

The material and formation of the upper insulation layer 220 are the same as those described with reference to FIG. 21, and detailed descriptions thereof will be omitted.

Next, as described in FIG. 22, a first pad 230 and a second pad 240 are formed. The first pad 230 is electrically connected to the current spreading layer 210 exposed in FIG. 26. Accordingly, the first pad 230 is electrically connected to the first semiconductor layer 110. This means that the first semiconductor layer 110 is electrically connected to an external power source or power supply through the first pad 230. Further, the second pad 240 is electrically connected to the reflective electrodes 140 exposed in FIG. 26. Thus, the second pad 240 is electrically connected to the second semiconductor layer 130. This means that the second semiconductor layer 130 is electrically connected to an external power source or power supply through the second pad 240.

Figure 27:
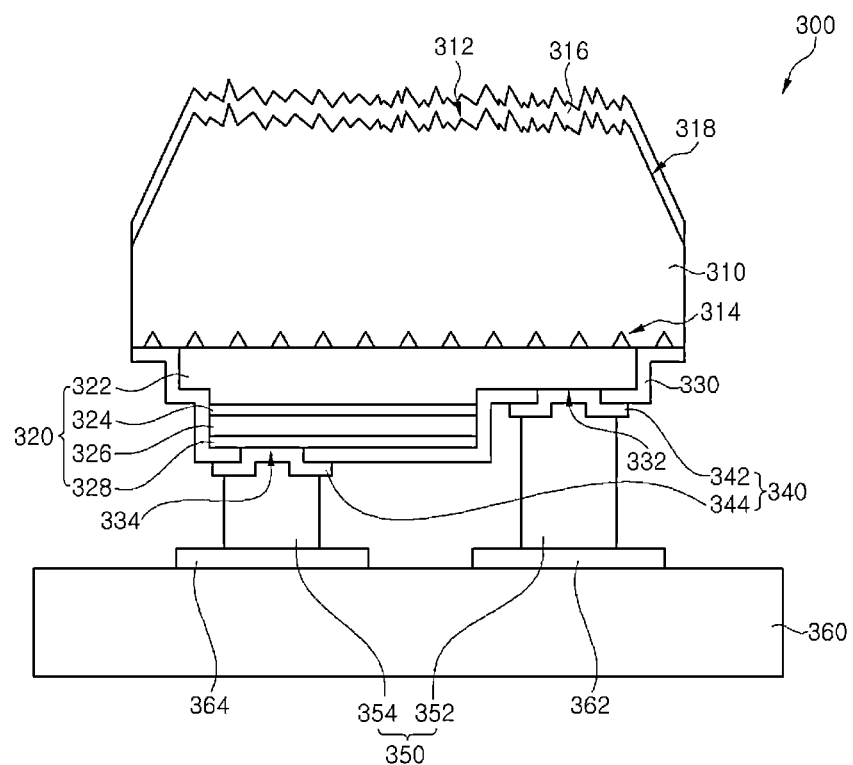
FIG. 27 is a sectional view of a light emitting device in accordance with a further embodiment of the present invention.

FIG. 27 is a sectional view of a light emitting device in accordance with a further embodiment of the present invention. In the aforementioned embodiments, the other surface of the substrate opposite to the surface of the substrate on which the semiconductor stack is formed is not subjected to texturing. In this embodiment, the other surface of the substrate is subjected to texturing to improve light extraction efficiency. Such a process of texturing the surface of the substrate may be applied to a flip chip type light emitting diode as well as the aforementioned embodiments.

Referring to FIG. 27, a light emitting device 300 includes a substrate 310, a light emitting structure 320, a passivation layer 330, pads 340, bumps 350, and a sub-mount 360.

The substrate 310 may be a growth substrate. The growth substrate may be any substrate, for example, a sapphire substrate, a silicon carbide substrate, a silicon substrate, and the like, without being limited thereto.

The light emitting structure 320 is formed on one surface of the substrate 310.

The substrate 310 has a ground texture 312 formed on the other surface thereof, and a converse patterned sapphire substrate (PSS) pattern 314 formed on the one surface thereof.

Further, the substrate 310 may include an anti-reflective layer 316 on the other surface thereof, and a chamfered edge 318.

The ground texture 312 is formed on the other surface of the substrate 310, and may be formed by grinding the other surface of the substrate 310 using a grinder (not shown), removing particles from the other surface of the substrate roughened by grinding through treatment using phosphoric acid or a mixture of sulfuric acid and phosphoric acid, and rounding sharp corners. As a result, the ground texture 312 may include a surface having irregular roughness, and round corners or protrusions subjected to rounding through treatment using phosphoric acid or a mixture of sulfuric acid and phosphoric acid.

The converse PSS pattern 314 may be formed on the one surface of the substrate 310. The converse PSS pattern 314 may include a plurality of grooves having a semi-spherical shape, a conical shape, or a faceted conical shape. In other words, the converse PSS pattern 314 may be provided in a structure wherein a plurality of semi-spherical grooves, a plurality of conical grooves, or a plurality of faceted conical grooves is formed on the one surface of the substrate 310.

Here, the interior of the converse PSS pattern 314, that is, the grooves of the PSS pattern, may be filled with a buffer layer (not shown) described below, or, a first conductive type semiconductor layer 322. In addition, although not shown in FIG. 27, the grooves of the PSS pattern 314 may be filled with an insulation material, such as silicon oxide or silicon nitride, such that semiconductor layers formed on the substrate 310 are selectively grown to form the light emitting structure 320, preferably, through epitaxial growth, thereby reducing dislocation density.

The anti-reflective layer 316 may be formed of silicon oxide, an oxide such as $TiO_2$, $AlTiO_2$, $CeO_2$, and the like, a nitride such as silicon nitride, or an insulation material such as $MgF_2$ and the like, and may have a multilayer structure including at least one of these insulation materials.

In FIG. 27, the anti-reflective layer 316 is illustrated as being disposed not only on the ground texture 312 but also on the chamfered corners 318. However, it should be understood that the anti-reflective layer 316 may be disposed only on the ground texture 312 without being disposed on the chamfered corners 318.

The chamfered corners 318 may be formed by chamfering corners of the substrate 310.

Therefore, the light emitting device 300 according to the embodiment of the invention includes the substrate 310, which is formed on one surface thereof with the converse PSS pattern 314, and on the other surface thereof with the ground texture 312, the anti-reflective layer 316 and the chamfered corner 318, whereby light generated in the light emitting structure 320 formed on the one surface of the substrate 310 can be efficiently emitted to the other surface of the substrate 310.

That is, the ground texture 312 serves to allow light to efficiently travel to the outside through the substrate 310 instead of being reflected inside the substrate 310. The converse PSS pattern 314 serves to allow light to efficiently travel through the substrate instead of being reflected towards the light emitting structure 320 when the light is generated in the light emitting structure 320 and travels through the substrate 310. Further, the anti-reflective layer 316 suppresses total reflection of the substrate by relieving a difference in index of refraction between the substrate 310 and the outside, that is, air. On the other hand, the chamfered corner 318 serves to allow light, which travels towards side surfaces of the substrate 310, to be efficiently emitted to the outside.

Figure 36:
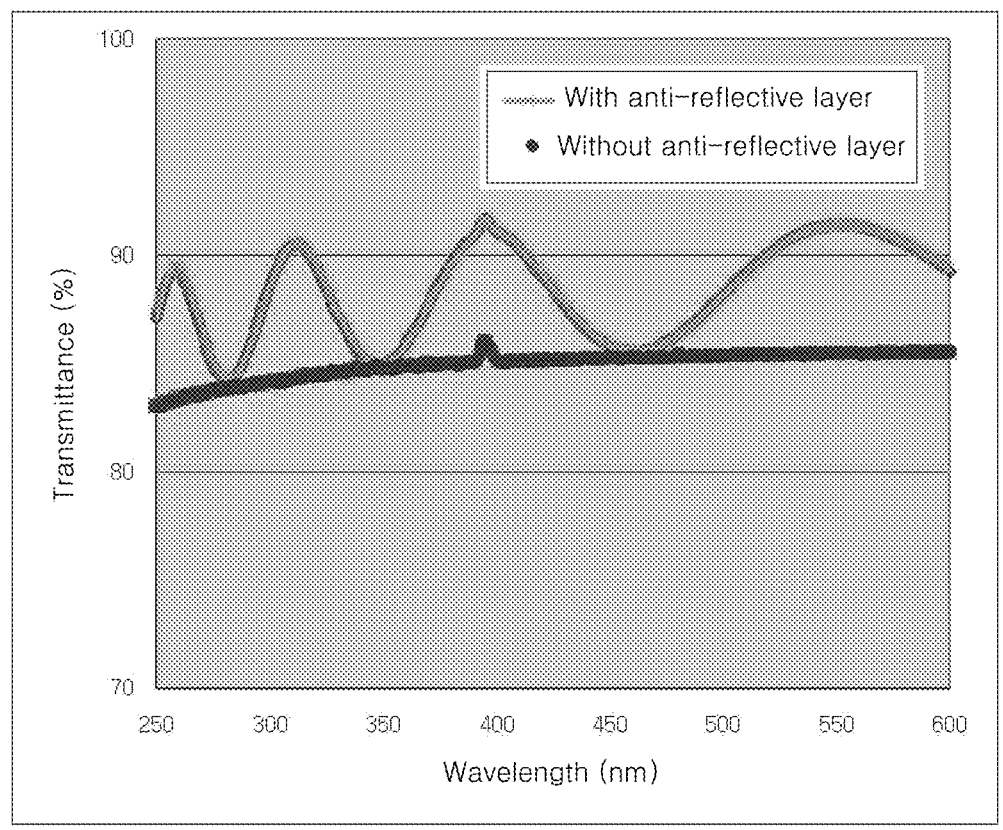
FIG. 36 is a graph depicting variation of transmittance upon use of an anti-reflective layer.

Here, as shown in FIG. 36, when the anti-reflective layer 316 is not formed on the substrate 310, the substrate has a light transmittance in percent in the mid-80s over a wide wavelength band. On the contrary, when the anti-reflective layer 316 is formed thereon, the substrate has a light transmittance in percent in the mid-80s and exhibits significant variation according to wavelengths. For example, the substrate has a significantly improved light transmittance of 90% or higher in a certain wavelength band, near about 310 nm, about 400 nm, or about 550 nm.

At this time, the material and thickness of the anti-reflective layer 316 may be selected according to wavelengths of light emitted from the light emitting structure 320, or according to desired wavelengths, thereby providing a maximum transmittance at a corresponding wavelength, that is, maximum luminous efficacy.

The light emitting structure 320 may include a first conductive type semiconductor layer 322, an active layer 324, a second conductive type semiconductor layer 326, and a transparent electrode layer 328. Further, the light emitting structure 320 may include a buffer layer (not shown), a super-lattice layer (not shown), or an electron blocking layer (not shown).

In the light emitting structure 320, the first conductive type semiconductor layer 322 is partially exposed by mesa-etching at least part of the second conductive type semiconductor layer 326 and the active layer 324.

The first conductive type semiconductor layer 322 may be a first conductive impurity-doped, for example, N-type impurity-doped, III-N-based compound semiconductor, for example, an (Al, Ga, In)N-based Group III nitride semiconductor layer. The first conductive type semiconductor layer 322 may be an N-type impurity doped GaN layer, that is, an N—GaN layer. Further, the first conductive type semiconductor layer 322 may be formed as a single layer or as multiple layers. For example, when the first conductive type semiconductor layer 322 is formed as multiple layers, the first conductive type semiconductor layer 322 may have a super-lattice layer.

The active layer 324 may be formed of a III-N-based compound semiconductor, for example, an (Al, Ga, In)N semiconductor layer. The active layer 324 may be formed as a single layer or as multiple layers, and emit light at a predetermined wavelength. Further, the active layer 324 may have a single quantum well structure including a single well layer (not shown), or a multi-quantum well structure in which well layers (not shown) and barrier layers (not shown) are alternately stacked one above another. Here, each of the well layer (not shown) and the barrier layer (not shown), or both may have a super-lattice structure.

The second conductive type semiconductor layer 326 may be a second conductive impurity, for example, P-type impurity-doped III-N-based compound semiconductor, for example, an (Al, Ga, In)N-based Group III nitride semiconductor layer. The second conductive type semiconductor layer 326 may be a P-type impurity doped GaN layer, that is, a P—GaN layer. Further, the second conductive type semiconductor layer 326 may be formed as a single layer or as multiple layers. For example, the second conductive type semiconductor layer 326 may have a super-lattice structure.

The transparent electrode layer 328 may include ITO, TCO such as ZnO or IZO, or a contact material such as Ni/Au, and makes ohmic contact with the second conductive type semiconductor layer 326.

The buffer layer (not shown) may be formed to relieve lattice mismatch between the substrate 310 and the first conductive type semiconductor layer 322. In addition, the buffer layer (not shown) may be formed as a single layer or as multiple layers. When the buffer layer is formed as multiple layers, the buffer layer may be composed of a low temperature buffer layer and a high temperature buffer layer. The buffer layer (not shown) may be composed of AlN.

The super-lattice layer (not shown) may be disposed between the first conductive type semiconductor layer 322 and the active layer 324, and may have a structure in which a plurality of III-N-based compound semiconductors, for example, (Al, Ga, In)N semiconductor layers, is stacked one above another. For example, the super-lattice layer may have a structure in which InN layers and InGaN layers are repeatedly stacked one above another. The super-lattice layer (not shown) may be formed before formation of the active layer 324 to prevent transfer of dislocations or defects to the active layer 324, thereby relieving formation of dislocations or defects in the active layer 324 while improving crystallinity of the active layer 324.

The electron blocking layer (not shown) may be disposed between the active layer 324 and the second conductive type semiconductor layer 326. The electron blocking layer may be provided to improve efficiency in recombination of electrons and holes, and may be formed of a material having a relatively wide band gap. The electron blocking layer (not shown) may be formed of an (Al, In, Ga)N-based Group III nitride semiconductor, and may be, for example, a Mg-doped P—AlGaN layer.

The passivation layer 330 may be disposed on the substrate 310 including the light emitting structure 320. The passivation layer 330 serves to protect the light emitting structure 320 under the passivation layer from external environments, and may be formed of an insulation layer including a silicon oxide layer.

The passivation layer 330 may include a first opening 332 through which part of the surface of the first conductive type semiconductor layer 322 exposed by mesa etching is exposed, and a second opening 334 through which part of the surface of the second conductive type semiconductor layer 326 is exposed.

The pads 340 may include a first pad 342 and a second pad 344. The first pad 342 may be disposed on the substrate 310 including the passivation layer 330 thereon, and may contact the first conductive type semiconductor layer 322 exposed through the first opening 332. The second pad 344 may be disposed on the substrate 310 including the passivation layer 330 thereon, and may contact the second conductive type semiconductor layer 326 exposed through the second opening 334.

The pads 340 may include Ni, Cr, Ti, Al, Ag, or Au.

The bumps 150 may include a first bump 352 and a second bump 354. The first bump 352 may be disposed on the first pad 342 and the second bump 354 may be disposed on the second pad 344. The bumps 350 serve to support the substrate 310 including the light emitting structure 320 on the sub-mount 360, and are disposed between the sub-mount 360 and the light emitting structure 320 to separate the light emitting structure 320 and the substrate from the sub-mount 360. The bumps 350 may include Au.

The sub-mount 360 may include a first electrode 362 and a second electrode 364 disposed on one surface thereof. The first electrode 362 and the second electrode 364 may be respectively connected to the first pad 352 and the second pad 354 when the substrate 310 including the light emitting structure 320 is mounted on the sub-mount 360.

FIG. 28 to FIG. 34 are sectional views illustrating a method of manufacturing the light emitting device of FIG. 27.

Figure 28:
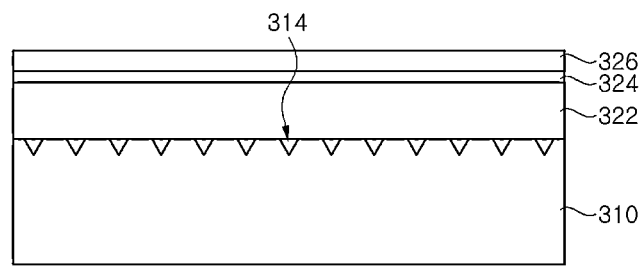
FIG. 28 to FIG. 34 are sectional views illustrating a method of manufacturing the light emitting device of FIG. 27.

Referring to FIG. 28, a substrate 310 is prepared.

The substrate 310 may be a growth substrate. The growth substrate may be a sapphire substrate, a silicon carbide substrate, or a silicon substrate. In this embodiment, the substrate 310 may be a sapphire substrate.

Next, a plurality of semiconductor layers is formed on one surface of the substrate 310. The plurality of semiconductor layers may include a first conductive type semiconductor layer 322, an active layer 324, and a second conductive type semiconductor layer 326.

The plurality of semiconductor layers may be formed through epitaxial growth using chemical vapor deposition such as MOCVD and the like.

Before forming the plurality of semiconductor layers, a converse PSS pattern 314 may be formed on one surface of the substrate 310. When the plurality of semiconductor layers is formed on the substrate 310 including the converse PSS pattern 314 thereon, the semiconductor layers may be selectively grown on a region of the substrate 310 on which the converse PSS pattern 314 is not formed, that is, on a predetermined area of the surface of the substrate 310, thereby enabling control of dislocation density in the semiconductor layers.

The converse PSS pattern 314 may be formed by forming a photoresist pattern (not shown) having a plurality of open regions through which a predetermined area of one surface of the substrate 310 is exposed, followed by etching the one surface of the substrate 310 to a predetermined thickness using the photoresist pattern (not shown) as a mask. Etching of the substrate 310 may be realized by wet etching or dry etching. Wet etching may be performed using a wet etching solution which contains phosphoric acid and sulfuric acid, and dry etching may be performed by ICP etching using an ICP device.

The shape of the converse PSS pattern 314 may be determined depending upon the shape of the open regions of the photoresist pattern (not shown). That is, when the open regions of the photoresist pattern (not shown) have a circular shape, the converse PSS pattern 314 may be realized in the form of a plurality of grooves having a semi-spherical or conical shape, and when the open regions of the photoresist pattern (not shown) have a polygonal shape including a triangular shape, the converse PSS pattern 314 may be realized in the form of a plurality of grooves having a faceted conical shape including a triangular pyramidal shape.

Figure 29:
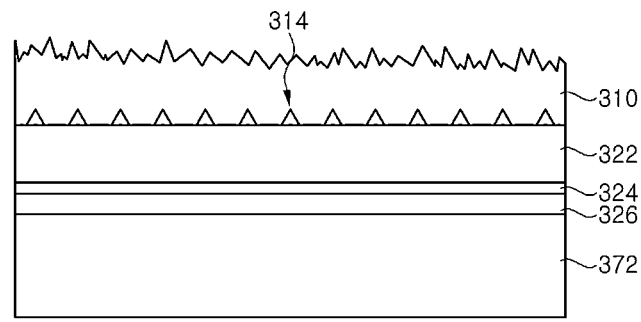

Referring to FIG. 29, next, a protective layer 372 is formed on the plurality of semiconductor layers. The protective layer 372 serves to protect the semiconductor layers upon grinding and treatment using phosphoric acid or a mixture of sulfuric acid and phosphoric acid described below. The protective layer 372 may be formed of a synthetic resin, such as a photoresist, or may be formed of insulation materials such as silicon oxide, nitride oxide, and the like.

Next, the other surface of the substrate 310 is subjected to grinding using a grinder.

In this operation, the substrate 310 is ground to a constant thickness. That is, the thickness of the substrate 310 is reduced as compared with the substrate 310 shown in FIG. 28. For example, when the substrate 310 shown in FIG. 28 has a thickness of about 450 µm, the substrate 310 subjected to grinding may have a thickness of 300 µm or less, preferably 200 µm. In this regard, since the substrate 310 described with reference to FIG. 28 must endure thermal impact or stress due to formation of the plurality of semiconductor layers on the one surface of the substrate 310, the substrate 310 described with reference to FIG. 28 preferably has a high thickness. However, it is desirable that the substrate 310 of the light emitting device 300 have a relatively thin thickness to allow light to pass through the substrate 310. For this reason, the thickness of the substrate 310 is reduced.

Thereafter, the other surface of the substrate 310 subjected to grinding is subjected to treatment using a phosphoric acid solution or a solution of sulfuric acid and phosphoric acid to form a ground texture on the other surface of the substrate 310, as shown in FIG. 29. Thus, the ground texture 312 means a surface shape formed by treating the other surface of the substrate 310 using phosphoric acid or a mixture of sulfuric acid and phosphoric acid after grinding the other surface of the substrate 310.

Here, surface roughness of the ground texture 312 may be adjusted by suitably adjusting conditions for grinding and treatment with phosphoric acid solution or a solution of sulfuric acid and phosphoric acid.

Figure 35:
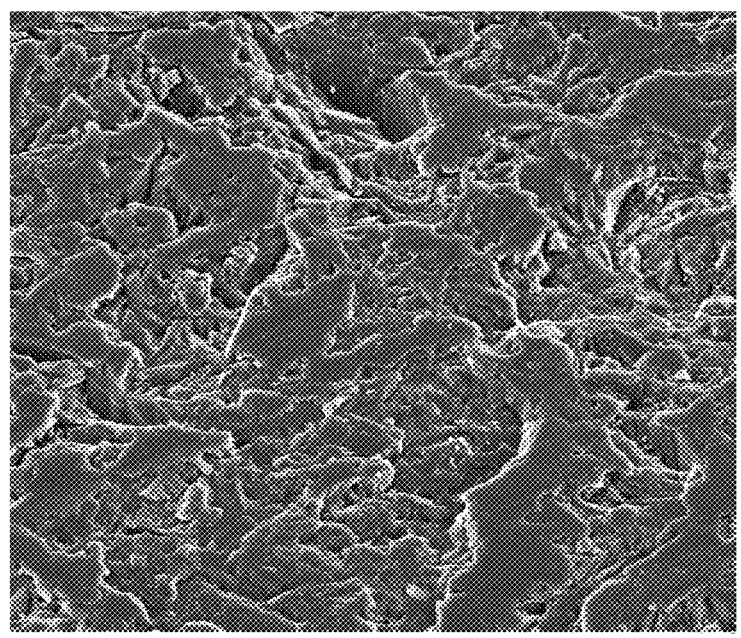
FIG. 35 is a picture showing a substrate surface subjected to grinding.

Specifically, the other surface of the substrate 310 subjected to grinding has irregular protrusions and depressions as shown in FIG. 35. Here, surface roughness of the substrate 310 subjected to grinding may be adjusted by adjusting roughness of a blade or pad of the grinder or a grinding time. In addition, surface roughness of the substrate 310 may be adjusted by adjusting a processing time upon treatment of the ground substrate 310 with phosphoric acid solution or a solution of sulfuric acid and phosphoric acid. For example, when the grinder pad has high roughness and phosphoric acid or sulfuric-phosphoric acid treatment is performed in a short period of time, the ground texture 312 may have high surface roughness. Alternatively, when the grinder pad has low roughness and phosphoric acid or sulfuric-phosphoric acid treatment is performed in a relatively long period of time, the ground texture 312 may have relatively low surface roughness.

Figure 30:
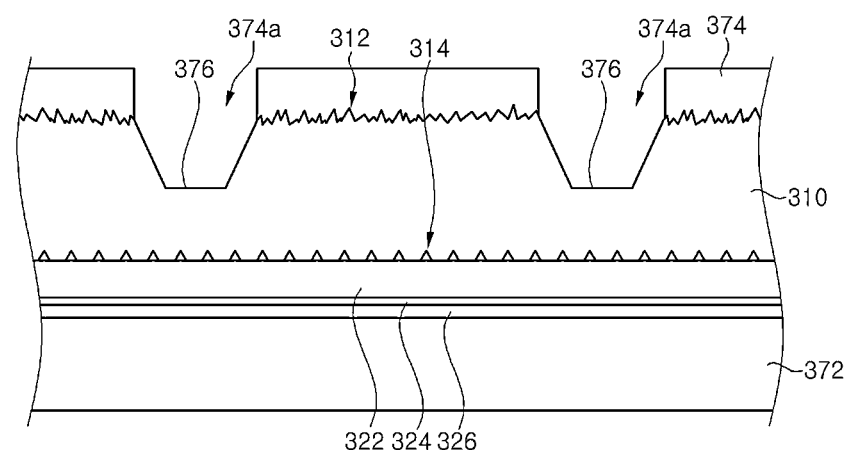

Referring to FIG. 30, next, a photoresist pattern 174 is formed on the other surface of the substrate 310.

The photoresist pattern 374 may include a plurality of open regions 374a through which a predetermined area of the other surface of the substrate 310 is exposed. The photoresist pattern 374 may be used as a hard mask (not shown). That is, a hard mask comprising a silicon oxide layer, a nitride layer, a metal layer, or the like may be formed on the other surface of the substrate 310.

Thereafter, a plurality of parathion grooves 375 is formed on the other surface of the substrate 310 using the photoresist pattern 374 or the hard mask (not shown). In this case, the photoresist pattern 374 may be formed using a photoresist.

Each of the dividing groove 376 serves to define a region that separates the substrate 310, and are preferably disposed corresponding to a region between the light emitting structures 320 described below.

Here, the dividing grooves 376 preferably have slanted sidewalls. This is because sidewalls of the dividing grooves 376 form the chamfered corners 318 after division of the substrate 310.

The dividing grooves 376 may be formed by wet etching or dry etching. Wet etching may be performed using a wet etching solution which contains phosphoric acid and sulfuric acid, and dry etching may be performed by ICP etching using an ICP device.

Figure 31:
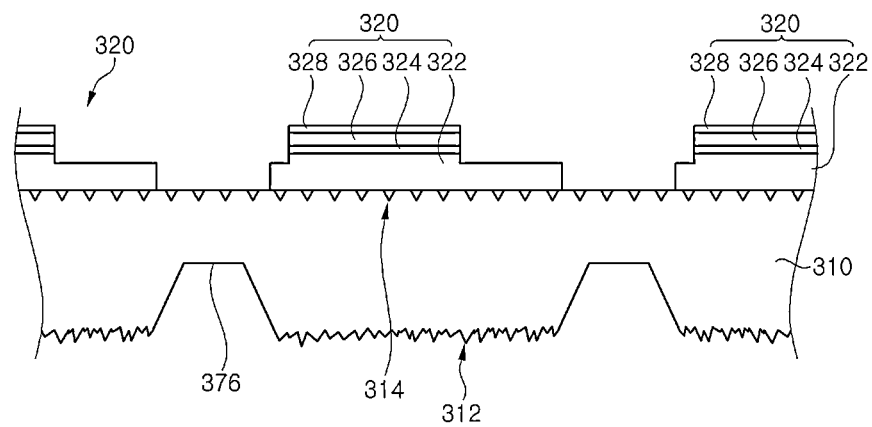

Referring to FIG. 31, light emitting structures 320 may be formed by removing the protective layer 372 from the one surface of the substrate 310, followed by etching the plurality of semiconductor layers.

In this case, etching of the plurality of semiconductor layers may include two processes. That is, etching of the plurality of semiconductor layers may include divisional etching to divide the plurality of semiconductor layers into a plurality of light emitting structures 320 through etching, and mesa etching for exposing the first conductive type semiconductor layer.

Divisional etching means a process of etching all of the plurality of semiconductor layers to divide the plurality of semiconductor layers into the plurality of light emitting structures 320. In addition, mesa etching means a process of partially etching the second conductive type semiconductor layer 326 and the active layer 324 to expose the first conductive type semiconductor layer 322. Here, divisional etching may be performed prior to mesa etching, or vice versa.

In divisional etching of the semiconductor layers, the regions of the semiconductor layers corresponding to the dividing grooves 376 are etched.

On the other hand, the transparent electrode layer 328 may be formed on the second conductive type semiconductor layer 326 after divisional etching and mesa etching. Alternatively, the transparent electrode layer 328 may be formed on the second conductive type semiconductor layer 326 before divisional etching and mesa etching, followed by etching together with the second conductive type semiconductor layer 326 upon divisional etching and mesa etching.

Figure 32:
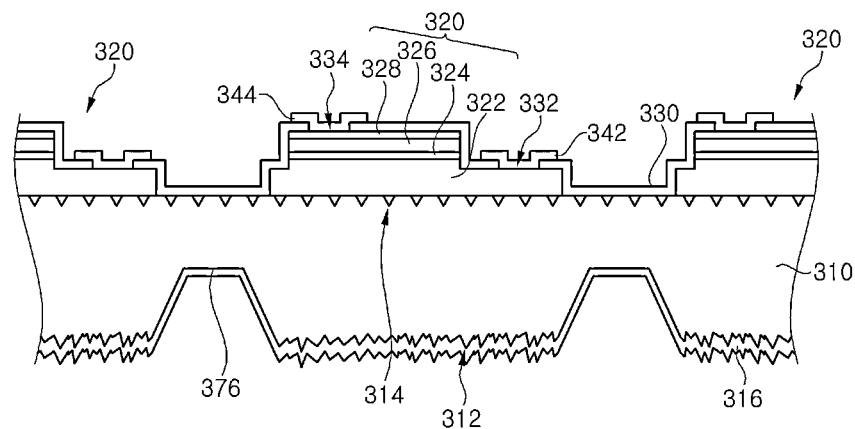

Referring to FIG. 32, after the etching process to form the light emitting structures 320, a passivation layer 330 is formed to protect the light emitting structure 320.

The passivation layer 330 may be formed of an insulation material including silicon nitride or silicon oxide.

The passivation layer 330 may include a first opening 332 and a second opening 334 which partially expose the first conductive type semiconductor layer 322 and the transparent electrode layer 328 of the light emitting structure 320, respectively.

Next, a first pad 342 and a second pad 344 are formed on the passivation layer 330 to be connected to the first conductive type semiconductor layer 322.

The first pad 342 and the second pad 344 may be formed by forming a pad material on the passivation layer 330, followed by patterning the pad material.

On the other hand, an anti-reflective layer 316 may be formed on the other surface of the substrate 310. In this embodiment, the anti-reflective layer 316 is formed on the other surface of the substrate 310 after the dividing grooves 376 are formed thereon. However, it should be understood that the anti-reflective layer 316 may be formed at any time after the ground texture 312 is formed. That is, the antireflective layer 316 may be formed at any time after forming the ground texture 312 described with reference to FIG. 29 and before forming a first bump 352 and a second bump 354 shown in FIG. 33.

In the method for manufacturing the light emitting device according to the embodiment of the invention, the other surface of the substrate 310 is subjected to treatment with phosphoric acid or a mixture of sulfuric acid and phosphoric acid to form the ground texture 312, followed by etching the plurality of semiconductor layers to form the light emitting structure 320. Alternatively, however, the light emitting structure 320 may be first formed by etching the plurality of semiconductor layers, and then, the ground texture 312 may be formed on the other surface of the substrate 310 through treatment of the other surface of the substrate 310 with phosphoric acid or a mixture of sulfuric acid and phosphoric acid.

Figure 33:
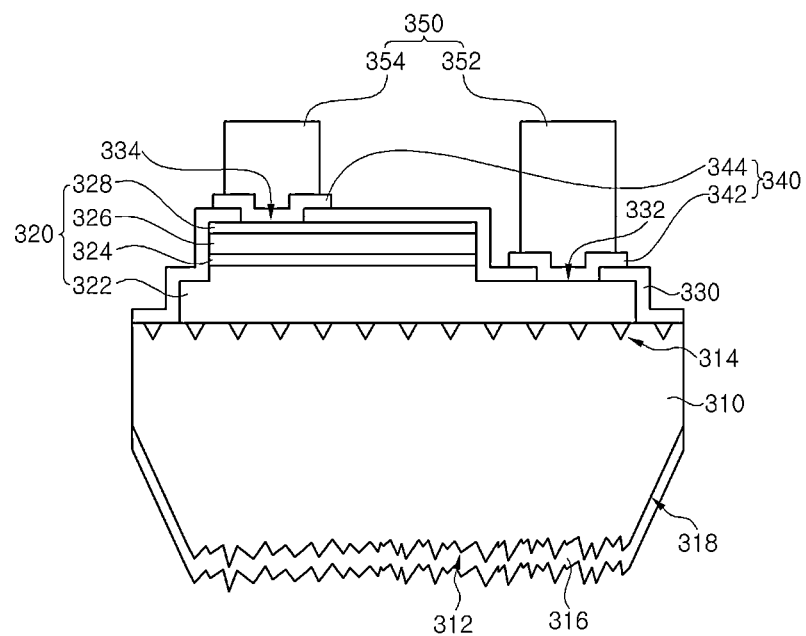

Referring to FIG. 33, after forming the first pad 342 and the second pad 344, a bump forming process to form a first bump 352 and a second bump 354 on the first pad 342 and the second pad 344, respectively, and a substrate dividing process to divide the substrate 310 are performed.

The bump forming process may be performed prior to the substrate dividing process, or vice versa.

The substrate 310 may be divided by scribing on the dividing grooves 376 using a diamond wheel or a laser.

Figure 34:
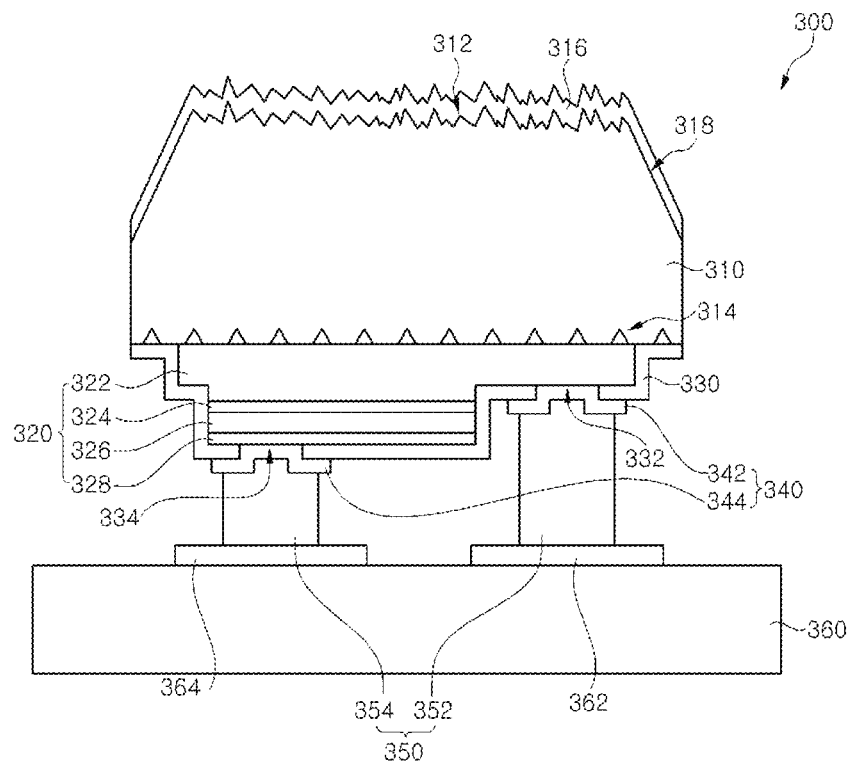

Referring to FIG. 34, a sub-mount 360 having a first electrode 362 and a second electrode 364 on one surface thereof is prepared.

Thereafter, after the sub-mount 360 is aligned with the substrate 310 such that the first bump 352 faces the first electrode 362 and the second bump 354 faces the second electrode 364, the first bump 352 and the second bump 354 are bonded to the first electrode 362 and the second electrode 364, respectively. As a result, a plurality of flip chip-bonded light emitting devices 300 is provided.

Although some embodiments have been described above, it should be understood that the present invention is not limited to these embodiments and may be modified in various ways. In addition, technical features of a certain embodiment may also be applied to other embodiments.

What is claimed is:

1. A light-emitting diode, comprising:
   a substrate;
   a first semiconductor layer disposed on the substrate;
   an active layer disposed on the first semiconductor layer;
   a second semiconductor layer disposed on the active layer and having a conductivity type different than that of the first semiconductor layer;
   a reflective metal layer disposed on the second semiconductor layer;
   a stress relief layer disposed directly on the reflective metal layer;
   a conductive barrier layer disposed on the stress relief layer such that the conductive barrier layer directly contacts the second semiconductor layer and covers a side surface of the reflective metal layer and the stress relief layer;
   a lower insulation layer disposed on the conductive barrier layer, and comprising a first opening that exposes a top portion of the conductive barrier layer and a second opening that exposes a portion of the first semiconductor layer; and
   an upper insulation layer disposed on the lower insulation layer, and comprising a first opening that is wider than the first opening of the lower insulation layer and that exposes the top portion of the conductive barrier layer exposed by the first opening of the lower insulation layer,
   wherein the stress relief layer is disposed between the reflective metal layer and the conductive barrier layer, and is configured to absorb stress caused by differences in the coefficient of thermal expansion of the reflective metal layer and the conductive barrier layer.

2. The light-emitting diode of claim 1, further comprising an antireflective layer disposed on the substrate, wherein the substrate comprises a pattern of depressions recessed from a surface of the substrate, and the antireflective layer is disposed between the pattern of depressions.

3. The light-emitting diode of claim 1, wherein the coefficient of thermal expansion of the stress relief layer is greater than or equal to that of the conductive barrier layer and is less than or equal to that of the reflective metal layer.

4. The light emitting diode of claim 1, wherein the reflective metal layer comprises at least one of Al and Ag.

5. The light-emitting diode of claim 1, wherein the conductive barrier layer comprises at least one of W, TiW, Mo, Ti, Cr, Pt, Rh, Pd, and Ni.

6. The light-emitting diode of claim 5, wherein the reflective metal layer comprises Al, the conductive barrier layer comprises at least one of W, TiW and Mo, and the stress relief layer comprises a single layer comprising at least one of Ag, Cu, Ni, Pt, Ti, Rh, Pd and Cr or a composite layer comprising at least one of Cu, Ni, Pt, Ti, Rh, Pd and Au.

7. The light-emitting diode of claim 5, wherein the reflective metal layer comprises Al, the conductive barrier layer comprises at least one of Ti, Cr, Pt, Rh, Pd and Ni, and the stress relief layer comprises a single layer comprising at least one of Ag and Cu or a composite layer comprising at least one of Ni, Au, Cu, and Ag.

8. The light-emitting diode of claim 5, wherein the reflective metal layer comprises Ag, the conductive barrier layer comprises at least one of W, TiW, and Mo, and the stress relief layer comprises a single layer comprising at least one of Cu, Ni, Pt, Ti, Rh, Pd, and Cr or a composite layer comprising at least one of Cu, Ni, Pt, Ti, Rh, Pd, Cr and Au.

9. The light-emitting diode of claim 5, wherein the reflective metal layer comprises Ag, the conductive barrier layer comprises at least one of Pt and Ni, and the stress relief layer comprises a single layer comprising at least one of Cu, Cr, Rh, Pd, TiW, and Ti or a composite layer comprising at least one of Ni, Au, and Cu.

10. The light-emitting diode of claim 1, wherein:
   the light-emitting diode further comprises an ohmic bonding layer disposed between the reflective metal layer and the second semiconductor layer, and
   the ohmic bonding layer comprises at least one of Ni, Pt, ITO, and ZnO.

11. The light-emitting diode of claim 1, wherein a lateral profile of the active layer and the second semiconductor layer has an inclination of 20 to 70 degrees with respect to a surface of the first semiconductor layer.

12. The light-emitting diode of claim 1, further comprising a current spreading layer disposed on the lower insulation layer and disposed on the portion of the first semiconductor through the second opening of the lower insulation layer.

13. The light-emitting diode of claim 12, wherein the active layer and the second semiconductor layer form a mesa and the lower insulation layer is disposed on a side wall of the mesa.

14. A method of fabricating a light emitting diode, the method comprising:

sequentially forming a first semiconductor layer, an active layer, and a second semiconductor layer on a substrate;

forming a mesa area by etching the second semiconductor layer and the active layer such that a surface of the first semiconductor layer is exposed through the mesa area; and forming a photoresist pattern on the mesa area;

forming a reflective metal layer on the second semiconductor layer through a space opened by the photoresist pattern such that the reflective metal layer is configured to reflect light emitted from the active layer;

forming a stress relief layer directly on the reflective metal layer;

forming a conductive barrier layer to directly contact the second semiconductor layer;

forming a lower insulation layer on the conductive barrier layer and the first semiconductor layer such that the lower insulation layer comprises a first opening exposing a top portion of the conductive barrier layer and a second opening exposing the first semiconductor layer;

forming an upper insulation layer disposed on the lower insulation layer such that the upper insulation comprises a first opening that is wider than the first opening of the lower insulation layer and that exposes the top portion of the conductive barrier layer exposed by the first opening of the lower insulation layer; and removing the photoresist pattern.

15. The method of claim 14, wherein the photoresist pattern comprises an overhang structure and an upper portion of the overhang structure has a greater width than a lower portion of the overhang structure.

16. The method of claim 14, wherein the reflective metal layer and the stress relief layer are formed by anisotropic deposition and the conductive barrier layer is formed by isotropic deposition.

17. The method of claim 14, wherein the mesa area is a stripe type or hole type.

18. The method of claim 14, wherein forming the mesa area further comprises forming a side wall of the mesa by etching the second semiconductor layer and the active layer.

19. The method of claim 18, wherein forming the lower insulation layer further comprises forming the lower insulation layer on the side wall of the mesa.

20. The method of claim 19, further comprising: forming a current spreading layer disposed on the lower insulation layer and the first semiconductor through the second opening of the lower insulation layer, wherein forming the upper insulation layer further comprises forming the upper insulation layer on the current spreading layer.

* * * * *